(12) United States Patent
Sharma et al.

(10) Patent No.: US 12,406,956 B2
(45) Date of Patent: Sep. 2, 2025

(54) BILAYER MEMORY STACKING WITH COMPUTER LOGIC CIRCUITS SHARED BETWEEN BOTTOM AND TOP MEMORY LAYERS

(71) Applicant: INTEL CORPORATION, Santa Clara, CA (US)

(72) Inventors: Abhishek A. Sharma, Hillsboro, OR (US); Van H. Le, Beaverton, OR (US); Kimin Jun, Portland, OR (US); Wilfred Gomes, Portland, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 856 days.

(21) Appl. No.: 17/462,058

(22) Filed: Aug. 31, 2021

(65) Prior Publication Data

US 2023/0064541 A1     Mar. 2, 2023

(51) Int. Cl.

| | |
|---|---|
| *H01L 23/00* | (2006.01) |
| *H01L 21/768* | (2006.01) |
| *H01L 23/48* | (2006.01) |
| *H01L 25/00* | (2006.01) |
| *H01L 25/065* | (2023.01) |
| *H01L 25/18* | (2023.01) |

(52) U.S. Cl.
CPC ........ *H01L 24/32* (2013.01); *H01L 21/76898* (2013.01); *H01L 23/481* (2013.01); *H01L 24/83* (2013.01); *H01L 25/0657* (2013.01); *H01L 25/18* (2013.01); *H01L 25/50* (2013.01); *H01L 2224/32145* (2013.01); *H01L 2224/83896* (2013.01); *H01L 2924/1431* (2013.01); *H01L 2924/1436* (2013.01)

(58) Field of Classification Search
CPC .......... H01L 21/76898; H01L 21/8221; H01L 23/481; H01L 24/32; H01L 24/83; H01L 25/50; H01L 25/0657; H01L 25/18; H01L 27/0688; H01L 2224/32145; H01L 2224/83896; H01L 2225/06541; H01L 2924/1431; H01L 2924/1436; H10B 12/00; H10B 12/20; H10B 80/00
USPC ...................................................... 257/777
See application file for complete search history.

(56) References Cited

U.S. PATENT DOCUMENTS

| | | | |
|---|---|---|---|
| 9,672,917 B1 | 6/2017 | Costa et al. | |
| 11,018,264 B1 | 5/2021 | Gomes et al. | |
| 11,056,492 B1 * | 7/2021 | Gomes | G11C 11/4023 |
| 11,087,832 B1 | 8/2021 | Gomes et al. | |
| 11,335,686 B2 * | 5/2022 | Gomes | H10B 12/30 |

(Continued)

*Primary Examiner* — Jasmine J Clark
(74) *Attorney, Agent, or Firm* — Akona IP PC

(57) ABSTRACT

Integrated circuit (IC) devices implementing bilayer memory stacking with compute logic circuits shared between bottom and top memory layers are disclosed. An example IC device includes a first IC structure that includes one or more memory layers but not necessarily compute logic circuits, the first IC structure being bonded with a second IC structure that includes at least one layer of compute logic circuits and further includes one or more memory layers stacked above the compute logic circuits. The first and second IC structures may be bonded so that the compute logic circuits of the second IC structure may be communicatively coupled to memory layers of both the first and second IC structures.

20 Claims, 16 Drawing Sheets

(56) References Cited

U.S. PATENT DOCUMENTS

| | | |
|---|---|---|
| 2010/0157647 A1 | 6/2010 | Rinerson et al. |
| 2012/0068335 A1 | 3/2012 | Song |
| 2014/0124728 A1 | 5/2014 | Kim et al. |
| 2017/0271341 A1 | 9/2017 | Tanaka et al. |
| 2018/0082733 A1 | 3/2018 | Tanaka et al. |
| 2018/0226414 A1 | 8/2018 | Zhang |
| 2020/0035683 A1 | 1/2020 | Sharma et al. |
| 2021/0125990 A1 | 4/2021 | Gomes et al. |
| 2021/0134802 A1 | 5/2021 | Gomes et al. |
| 2021/0151438 A1 | 5/2021 | Gomes et al. |
| 2021/0159229 A1 | 5/2021 | Gomes et al. |

\* cited by examiner

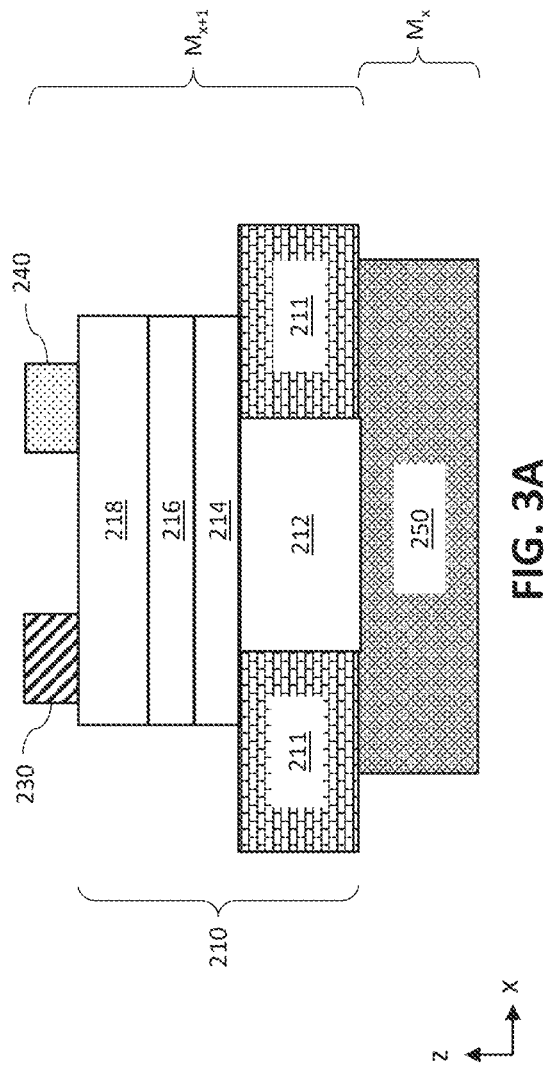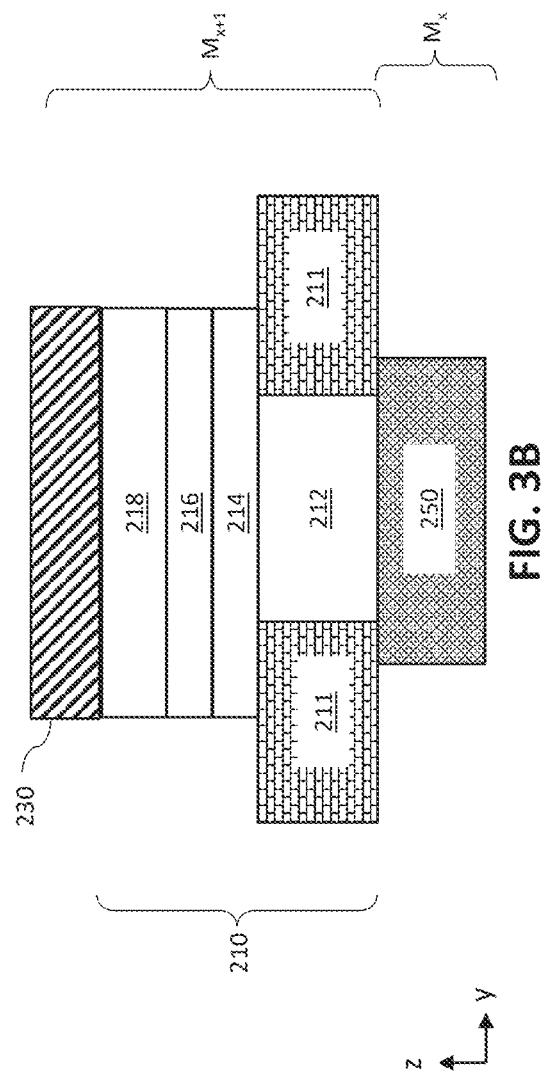

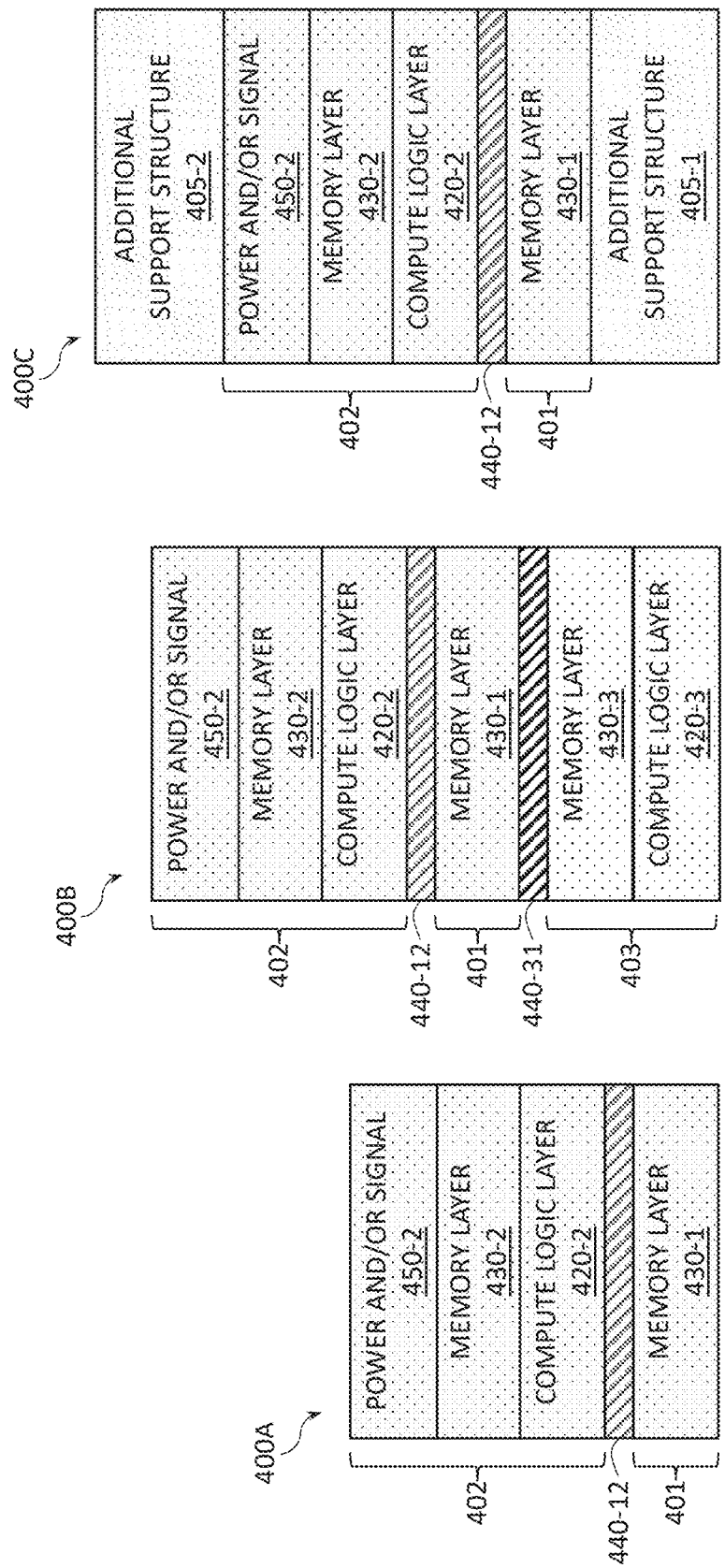

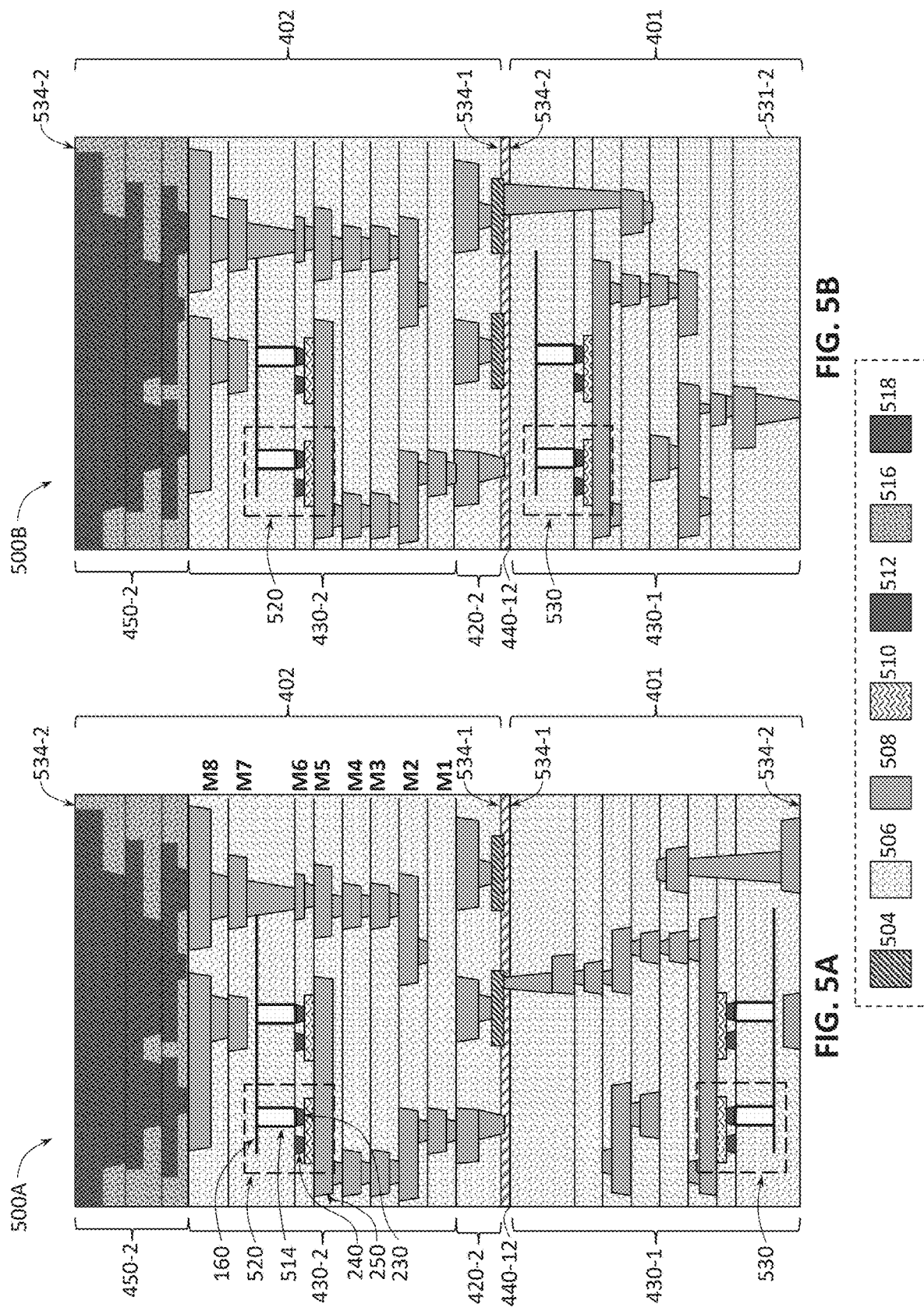

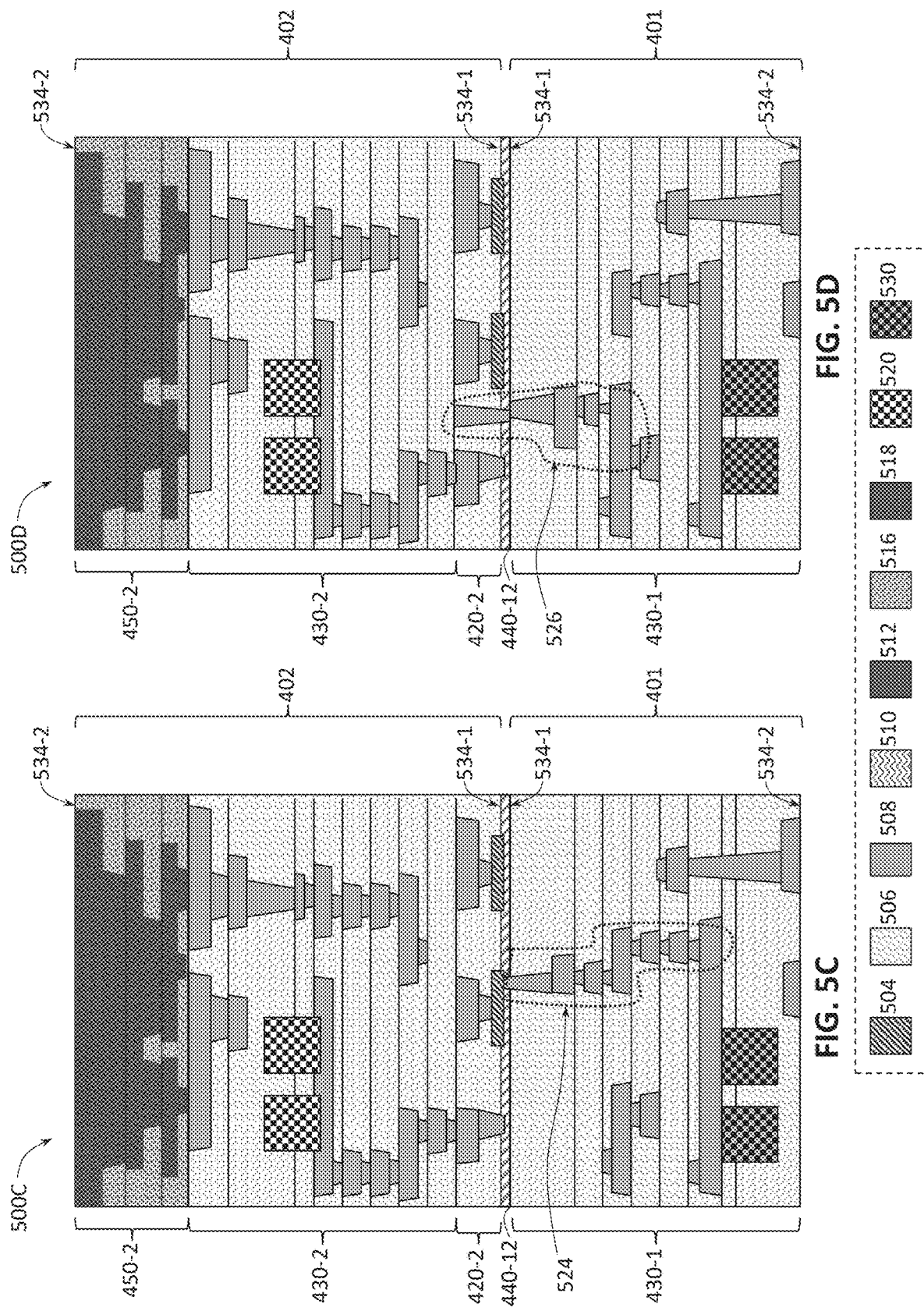

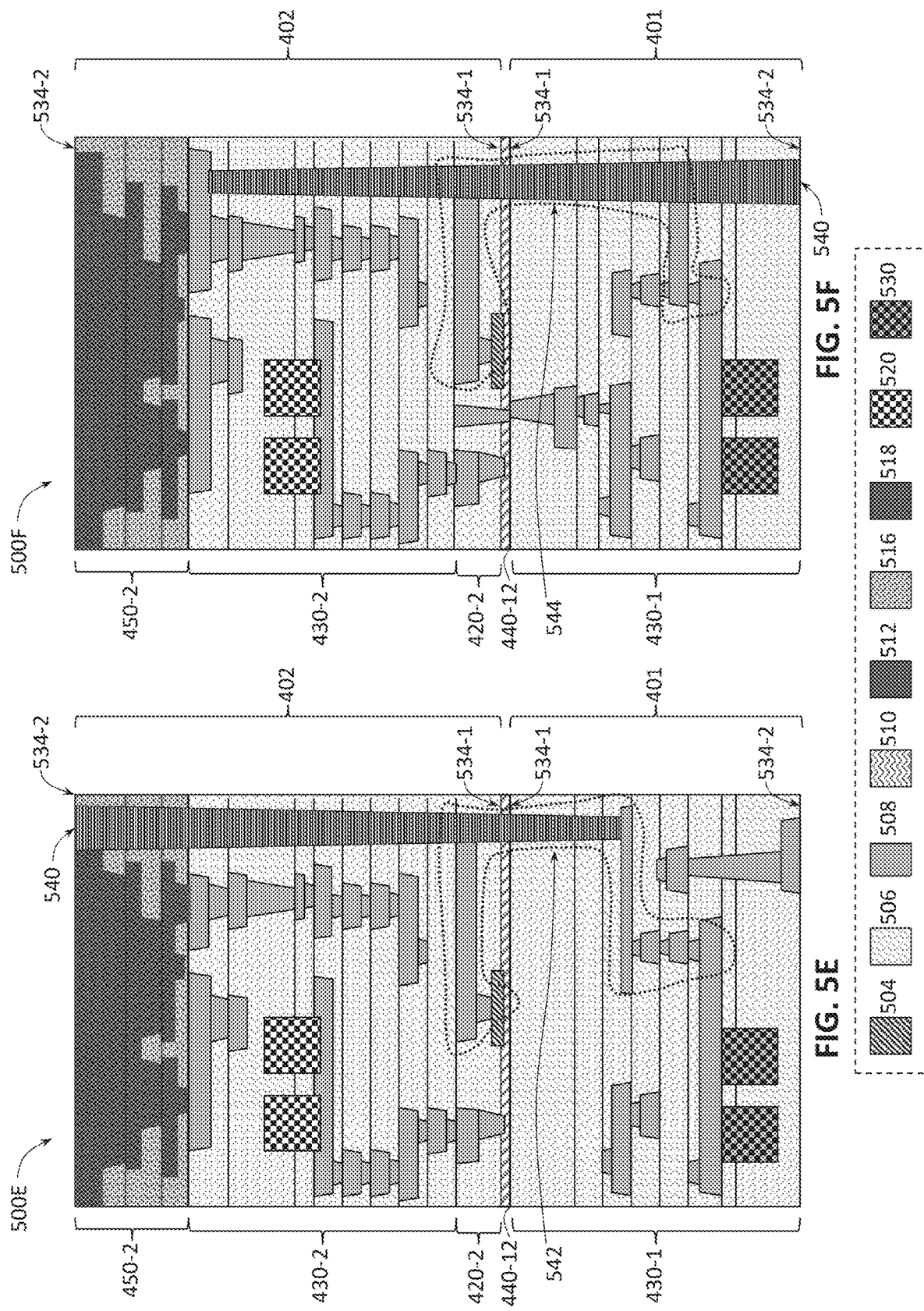

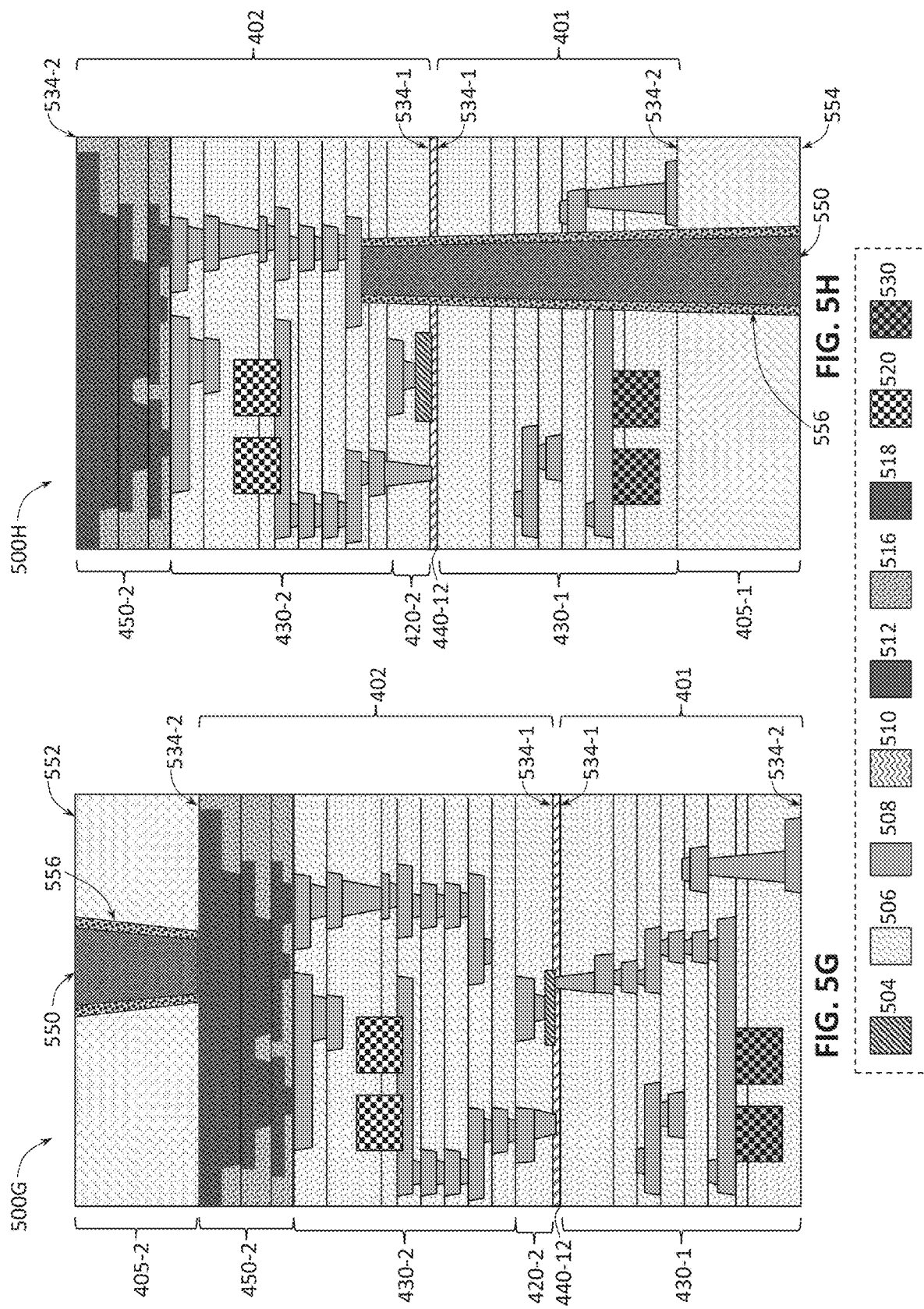

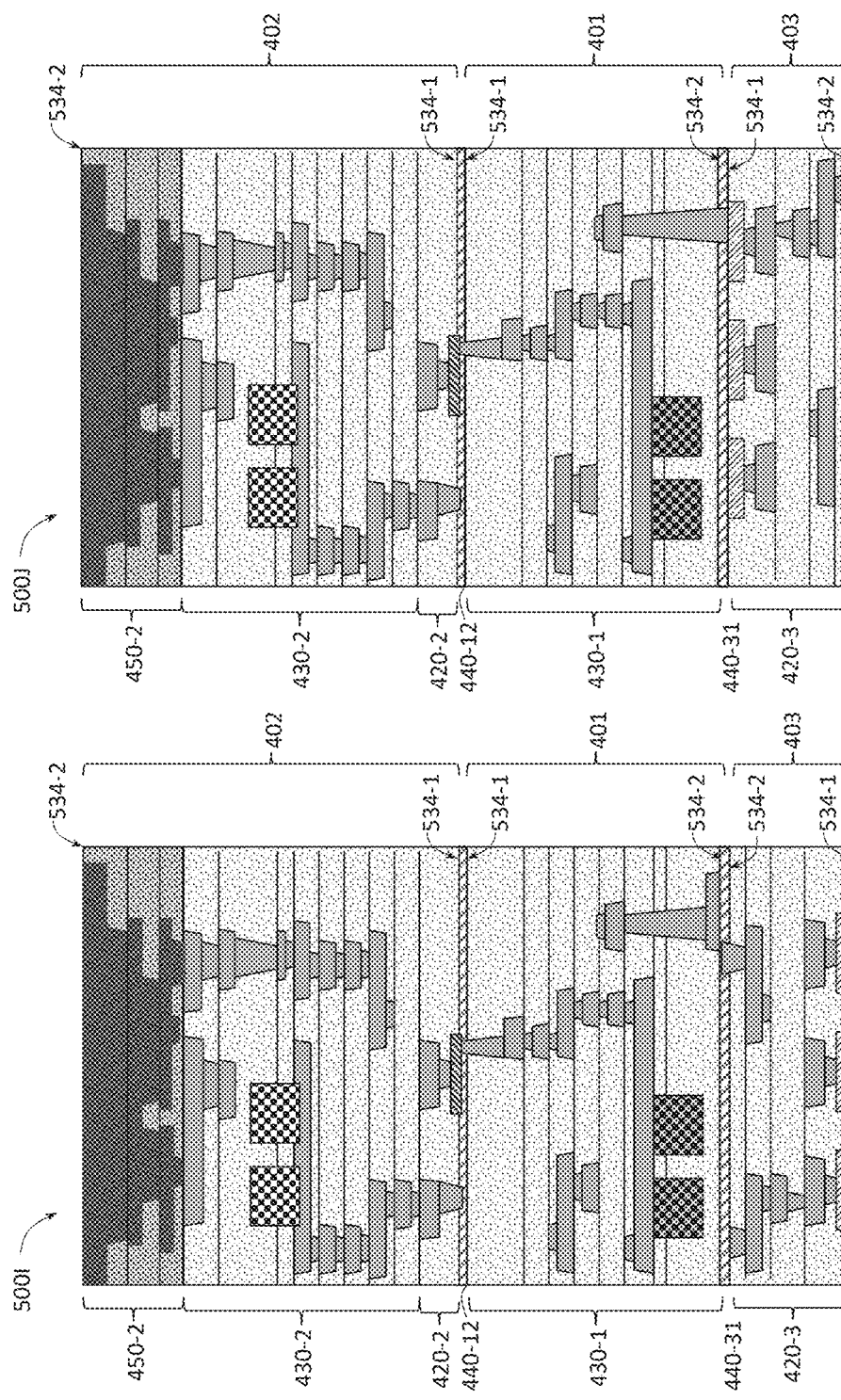

BILAYER MEMORY STACKING WITH COMPUTER LOGIC CIRCUITS SHARED BETWEEN BOTTOM AND TOP MEMORY LAYERS

BACKGROUND

Embedded memory is important to the performance of modern system-on-a-chip (SoC) technology. Low power and high density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3B are cross-sectional views of an example structure of the access TFT in the memory cell of FIGS. 2A-2B, according to some embodiments of the present disclosure.

FIGS. 4A-4C provide schematic illustrations of integrated circuit (IC) devices implementing bilayer memory stacking with compute logic circuits shared between bottom and top memory layers, according to various embodiments of the present disclosure.

FIGS. 5A-5K provide cross-sectional side views of example IC devices implementing bilayer memory stacking with compute logic circuits shared between bottom and top memory layers, according to various embodiments of the present disclosure.

DETAILED DESCRIPTION

Figure 1:
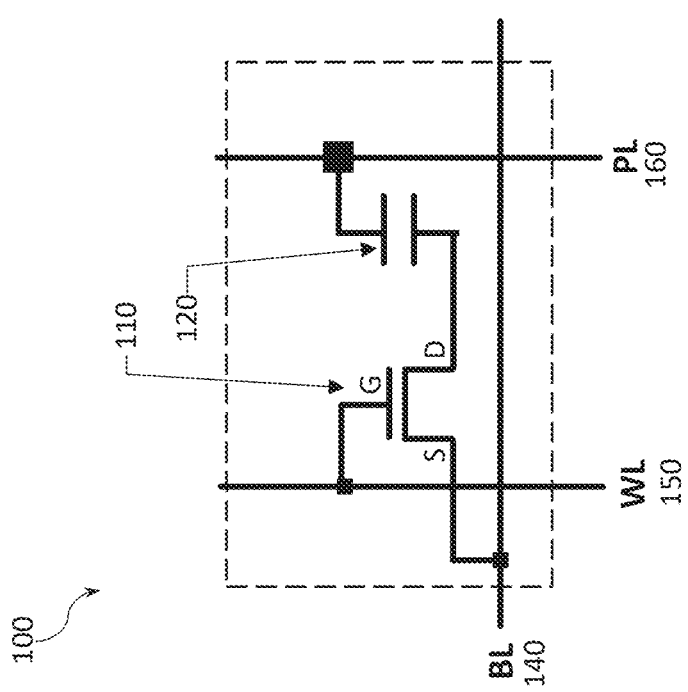
FIG. 1 provides an electric circuit diagram of a one access transistor (1T) and one capacitor (1C) (1T-1C) memory cell, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC devices implementing bilayer memory stacking with compute logic circuits shared between bottom and top memory layers as described herein, it might be useful to first understand phenomena that may come into play in certain IC arrangements. The following foundational information may be viewed as a basis from which the present disclosure may be properly explained. Such information is offered for purposes of explanation only and, accordingly, should not be construed in any way to limit the broad scope of the present disclosure and its potential applications.

Some memory devices may be considered "standalone" devices in that they are included in a chip that does not also include compute logic (where, as used herein, the term "compute logic devices" or simply "compute logic" or "logic devices," refers to IC components, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to dynamic random-access memory (DRAM) and in particular, embedded DRAM (eDRAM), because this type of memory has been introduced in the past to address the limitation in density and standby power of other types or memory. However, embodiments of the present disclosure are equally applicable to backed memory implemented using other technologies. Thus, in general, backend memory described herein may be implemented as eDRAM cells, spin-transfer torque random-access memory (STTRAM) cells, resistive random-access memory (RRAM) cells, or any other non-volatile memory cells.

As an example, a DRAM cell may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source or drain (S/D) terminal/region of the access transistor (e.g., to the source terminal/region of the access transistor), while the other S/D terminal/region of the access transistor (e.g., to the drain terminal/region) may be coupled to a bit-line (BL), and a gate terminal of the transistor may be coupled to a word-line (WL). Since such a memory cell can be fabricated with as little as a single access transistor, it can provide higher density and lower standby power versus some other types of memory in the same process technology.

Various 1T-1C memory cells have, conventionally, been implemented with access transistors being front end of line (FEOL), logic-process based, transistors implemented in an upper-most layer of a semiconductor substrate (such transistors may be referred to as "frontend transistors" or "FEOL transistors"). However, using standard logic transistors as access transistors of 1T-1C memory cells creates several challenges.

One challenge relates to the leakage of an access transistor, i.e., current flowing between the source and the drain of a transistor when the transistor is in an "off" state. Since reducing leakage of logic transistors in the scaled technology is difficult, implementing 1T-1C memory in advanced technology nodes (e.g., 10 nanometer (nm), 7 nm, 5 nm, and beyond) can be challenging. In particular, given a certain access transistor leakage, capacitance of the capacitor of a 1T-1C memory cell should be large enough so that sufficient charge can be stored on the capacitor to meet the corresponding refresh times. However, continuous desire to decrease size of electronic components dictates that the macro area of memory arrays continues to decrease, placing limitations on how large the top area (i.e., the footprint) of a given capacitor is allowed to be, which means that capacitors need to be taller in order to have both sufficiently small footprint area and sufficiently large capacitance. As the capacitor dimensions continue to scale, this in turn creates a challenge for etching the openings for forming the capacitors as tall capacitors with small footprint areas require higher aspect ratio openings, something which is not easy to achieve.

Another challenge associated with the use of logic transistors in 1T-1C memory cells relates to the location of the capacitors such memory cells. Namely, it may be desirable to provide capacitors in metal layers close to their corresponding access transistors. Since logic transistors are implemented as frontend transistors provided directly on the semiconductor substrate, the corresponding capacitors of 1T-1C memory cells then have to be embedded in lower metal layers in order to be close enough to the logic access transistors. As the pitches of lower metal layers aggressively scale in advanced technology nodes, embedding the capacitors in the lower metal layers poses significant challenges to the scaling of 1T-1C based memory.

Yet another challenge resides in that, given a usable surface area of a substrate, there are only so many frontend transistors that can be formed in that area, placing a significant limitation on the density of memory cells of a memory array.

Implementing memory in the backend of an IC device, i.e., in a back end of line (BEOL) layer that may include one or more interconnect layers (also referred to as "metal layers") may address some of the challenges described above.

Backend memory may be implemented using TFTs as access transistors of the memory cells embedded in the BEOL layer. A TFT is a special kind of a field-effect transistor made by depositing a thin film of an active semiconductor material, as well as a dielectric layer and metallic contacts, over a supporting layer that may be a non-conducting layer and a non-semiconductor layer. At least a portion of the active semiconductor material forms a channel of the TFT. This is different from conventional, non-TFT, FEOL logic transistors where the active semiconductor channel material is typically a part of a semiconductor substrate, e.g., a part of a silicon wafer. Using TFTs as access transistors of memory cells provides several advantages and enables unique architectures that were not possible with conventional, FEOL logic transistors. For example, one advantage is that a TFT may have substantially lower leakage than a logic transistor, allowing to relax the demands on the large capacitance placed on a capacitor of a 1T-1C memory cell. In other words, using a lower leakage TFT in a 1T-1C memory cell allows the memory cell to use a capacitor with lower capacitance and smaller aspect ratio while still meeting the same data retention requirements of other approaches, alleviating the scaling challenges of capacitors.

Additionally, or alternatively, to TFT-based memory, backend memory may be implemented using layer transfer to form access transistors of the memory cells embedded in the BEOL layer. Layer transfer may include epitaxially growing a layer of a highly crystalline semiconductor material on another substrate and then transferring the layer, or a portion thereof, to embed it in the BEOL layer provided over a second substrate. Channel regions of backend transistors then include at least portions of such transferred semiconductor material layer. Performing layer transfer may advantageously allow forming non-planar transistors, such as FinFETs, nanowire transistors, or nanoribbon transistors, in the BEOL layer. In some embodiments, transistors, or portions thereof (e.g., S/D regions) may be formed on the first substrate (i.e., on the substrate on which a layer of a highly crystalline semiconductor material is grown) before the layer transfer takes place, and then a layer with such transistors, or portions thereof, is transferred.

Layer transfer approach for providing backend memory may be particularly suitable for forming access transistors with channel regions formed of substantially single-crystalline semiconductor materials. On the other hand, TFT-based backend memory may be seen as an example of a monolithic integration approach because the semiconductor materials for the channel regions are deposited in a BEOL layer of an IC device, as opposed to being epitaxially grown elsewhere and then transferred, which may be particularly suitable for forming access transistors with channels formed of polycrystalline, polymorphous, or amorphous semiconductor materials, or various other thin-film channel materials. Whether a semiconductor material of a channel region for a given backend device (e.g., a backend transistor) has been provided by monolithic integration approach or by layer transfer can be identified by inspecting grain size of active semiconductor material of the device (e.g., of the semiconductor material of the channel region of a backend transistor). An average grain size of the semiconductor material being between about 0.5 and 1 millimeters (in which case the material may be polycrystalline) or smaller than about 0.5 millimeter (in which case the material may be polymorphous) may be indicative of the semiconductor material having been deposited in the BEOL layer of the device (i.e., monolithic integration approach), e.g., to form a TFT. On the other hand, an average grain size of the semiconductor material being equal to or greater than about 1 millimeter (in which case the material may be a single-crystal material) may be indicative of the semiconductor material having been included in the BEOL layer of the device by layer transfer. The discussions of monolithic integration vs. layer transfer approaches for forming backend memory are equally applicable to backend transistors that are not part of a memory array (e.g., if backend transistors are implemented in an IC device to serve as logic transistors, switches, or for any other purposes or in any other circuits).

Moving access transistors to the BEOL layer of an advanced complementary metal oxide semiconductor (CMOS) process, either by monolithic integration (e.g., using TFTs) or by layer transfer, means that their corresponding capacitors can be implemented in the upper metal layers with correspondingly thicker interlayer dielectric (ILD) and larger metal pitch to achieve higher capacitance. This eases the integration challenge introduced by embedding the capacitors.

Furthermore, when at least some access transistors are implemented as backend transistors, at least portions of different memory cells may be provided in different layers of a BEOL layer above a substrate, thus enabling a stacked architecture of memory arrays. In this context, the term "above" refers to a layer in the BEOL portion being further away from the FEOL portion of an IC device (e.g., the IC device 400 shown in FIGS. 4A-4C).

Fabricating multiple layers of memory arrays (i.e., memory layers) in the backend (e.g., in the BEOL layer) and ensuring that compute logic circuits, typically implemented in the frontend (e.g., in the FEOL layer), are shared among all of the memory layers is not an easy task. Embodiments of the present disclosure are based on recognition that, instead of fabricating a large number of memory layers in the backend of a single IC structure that also includes at least one layer of compute logic circuits communicatively coupled to the memory layers, a stack of two IC structures bonded together may be used. To that end, an example IC device may include a first IC structure that has one or more memory layers but not necessarily compute logic circuits, the first IC structure being bonded with a second IC structure that has at least one layer of compute logic circuits and further has one or more memory layers stacked above the compute logic circuits. The first and second IC structures may be bonded so that the compute logic circuits of the second IC structure may be communicatively coupled to memory layers of both the first and second IC structures. In this manner, compute logic circuits of the second IC structure may be shared between bottom and top memory layers and this type of sharing may be referred to as "bilayer memory stacking with compute logic circuits shared between bottom and top memory layers," where "bottom memory layer(s)" refer to one or more memory layers of one of the first and second IC structures (e.g., in the following, of the first IC structure 401 as described herein) and where "top memory layer(s)" refer to one or more memory layers of the other one of the first and second IC structures (e.g., in the following, of the second IC structure 402 as described herein). In some embodiments, bonding of the first and second IC structures may be such that the compute logic circuits of the second IC structure may, advantageously, be arranged in a stack between the memory layers of the first IC structure and the memory layers of the second IC structure. For example, if the compute logic circuits are implemented in the FEOL of the second IC structure, the memory layers are implemented in the BEOL of the second IC structure, and the back side of the second IC structure (i.e., the side to which the FEOL is closer than the BEOL) is the side being bonded with the first IC structure (e.g., in a back-to-back (b2b) bonding), then the compute logic circuits of the second IC structure are between the memory layers of the first IC structure and the memory layers of the second IC structure. In another example, if the compute logic circuits are implemented in the FEOL of the first IC structure, the memory layers are implemented in the BEOL of the first IC structure, and the back side of the first IC structure (i.e., the side to which the FEOL is closer than the BEOL) is the side being bonded with the second IC structure (e.g., in a b2b bonding) that includes its' own one or more memory layers, then the compute logic circuits of the first IC structure are between the memory layers of the first IC structure and the memory layers of the second IC structure.

Stacked backend memory architecture with multiple memory layers stacked in the backend may allow significantly increasing density of memory cells in a three-dimensional (3D) memory array having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of the 3D memory array with a given memory cell density. Furthermore, stacked backend memory architecture with bilayer memory stacking with compute logic circuits shared between bottom and top memory layers as described herein may be particularly advantageous in terms of reduced cost and ease of fabrication. For example, the cost may be reduced by sharing high-performance CMOS compute logic circuits between bottom and top memory layers, which circuits are typically several orders of magnitude more expensive than backend memory layers. On the other hand, the ease of fabrication may be assisted by the fact that instead of stacking a large number of backend memory layers on a single IC structure, the backend memory layers may be distributed between two IC structures to be bonded together.

In some embodiments, additional IC structures may be bonded with the first and second IC structures as described herein, where bilayer memory stacking as described herein may be implemented between multiple pairs of adjacent IC structures bonded (i.e., stacked) with one another. Thus, when looking at a given pair of IC structures bonded together, each implementing one or more memory layers, the one or more memory layers of one of the IC structures may be described as a "bottom memory layer" and the one or more memory layers of the other one of the IC structures may be described as a "top memory layer," but the latter may be the "bottom memory layer" as described herein when it is considered as a layer in a bilayer stacking pair with yet another IC structure with one or more memory layers bonded above it. Thus, different variations of bilayer memory stacking with compute logic circuits shared between bottom and top memory layers as described herein are possible and within the scope of the present disclosure based on the descriptions provided herein.

Although descriptions of the present disclosure may refer to compute logic devices (e.g., implemented using frontend transistors of a FEOL layer) or memory cells provided in a given layer of an IC structure, each layer of the IC structures described herein may also include other types of devices besides compute logic or memory devices described herein. For example, in some embodiments, FEOL layers with compute logic transistors may also include memory cells and/or BEOL layers with memory cells may also include compute logic transistors. In the following, the terms "compute logic" and "logic" may be used interchangeably. In general, a FEOL layer may include one or more layers, each including frontend components (e.g., compute logic circuits) and/or interconnects, and a BEOL layer may include one or more layers, each including backend components (e.g., backend memory) and/or interconnects.

Furthermore, some descriptions may refer to backend memory being TFT-based memory. However, embodiments of the present disclosure are equally applicable to backend memory implemented using layer transfer instead of, or in addition to, TFTs.

In addition, while some descriptions provided herein refer to memory cells with bottom-gated access transistors, embodiments of the present disclosure are not limited to only this design and include access transistors for different memory cells being of various other architectures, or a mixture of different architectures. For example, in various embodiments, access transistors of various layers of stacked backend memory described herein may include bottom-gated transistors, top-gated transistors, nanowire transistors, etc., all of which being within the scope of the present disclosure. Further, some descriptions may refer to a particular source or drain (S/D) region of a transistor being either a source region or a drain region. However, unless specified otherwise, which region of a transistor is considered to be a source region and which region is considered to be a drain region is not important because, as is common in the field of field-effect transistors (FETs), designations of source and drain are often interchangeable. Therefore, descriptions of some illustrative embodiments of the source and drain regions provided herein are applicable to embodiments where the designation of source and drain regions may be reversed. Unless explained otherwise, in some settings, the terms S/D region, S/D contact, and S/D terminal of a transistor may be used interchangeably, although, in general, the term "S/D contact" is used to refer to an electrically conductive structure for making a contact to a S/D region of a transistor, while the term "S/D terminal" may generally refer to either S/D region or S/D contact of a transistor.

In the following detailed description, various aspects of the illustrative implementations will be described using terms commonly employed by those skilled in the art to convey the substance of their work to others skilled in the art. For example, a term "interconnect" may be used to describe any element formed of an electrically conductive material for providing electrical connectivity to one or more components associated with an IC or/and between various such components. In general, the term "interconnect" may refer to both conductive lines (or, simply, "lines," also sometimes referred to as "traces" or "trenches") and conductive vias (or, simply, "vias"). In general, in context of interconnects, the term "conductive line" may be used to describe an electrically conductive element isolated by an insulator material (e.g., a low-k dielectric material) that is provided within the plane of an IC die. Such lines are typically stacked into several levels, or several layers, of a metallization stack. On the other hand, the term "via" may be used to describe an electrically conductive element that interconnects two or more lines of different levels. To that end, a via may be provided substantially perpendicularly to the plane of an IC die and may interconnect two lines in adjacent levels or two lines in not adjacent levels. A term "metallization stack" may be used to refer to a stack of one or more interconnects for providing connectivity to different circuit components of an IC chip. Sometimes, lines and vias may be referred to as "metal traces" and "metal vias", respectively, to highlight the fact that these elements include electrically conductive materials such as metals.

In another example, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials. If used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function. The terms "substantially," "close," "approximately," "near," and "about," generally refer to being within +/−20% of a target value (e.g., within +/−10% or within +/−5% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5K, such a collection may be referred to herein without the letters, e.g., as "FIG. 5." In order to not clutter the drawings, sometimes only one instance of a given element is labeled in a drawing with a reference numeral, although other similar elements may be shown.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number and type of memory layers, a certain number and type of memory cells, or a certain arrangement of interconnects), this is simply for ease of illustration, and more, or less, than that number may be included in the IC devices and related assemblies and packages according to various embodiments of the present disclosure. Still further, various views shown in some of the drawings are intended to show relative arrangements of various elements therein. In other embodiments, various IC devices and related assemblies and packages, or portions thereof, may include other elements or components that are not illustrated (e.g., transistor portions, various further components that may be in electrical contact with any of the illustrated components of the IC devices and related assemblies and packages, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more IC devices implementing bilayer stacking with compute logic circuits shared between bottom and top memory layers as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices implementing bilayer memory stacking with compute logic circuits shared between bottom and top memory layers as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIG. 1 provides an electric circuit diagram of an 1T-1C memory cell 100, according to some embodiments of the present disclosure. As shown, the 1T-1C cell 100 may include an access transistor 110 and a capacitor 120. The access transistor 110 has a gate terminal, a source terminal, and a drain terminal, indicated in the example of FIG. 1 as terminals G, S, and D, respectively. In the following, the terms "terminal" and "electrode/contact" may be used interchangeably. Furthermore, for S/D terminals, the terms "terminal" and "region" may be used interchangeably.

As shown in FIG. 1, in the 1T-1C cell 100, the gate terminal of the access transistor 110 may be coupled to a WL 150, one of the S/D terminals of the access transistor 110 may be coupled to a BL 140, and the other one of the S/D terminals of the access transistor 110 may be coupled to a first electrode of the capacitor 120. As also shown in FIG. 1, the other electrode of the capacitor 120 may be coupled to a capacitor plate-line (PL) 160 (also sometimes referred to as a "select-line" (SL)). As is known in the art, WL, BL, and PL may be used together to read and program the capacitor 120.

Each of the BL 140, the WL 150, and the PL 160, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

In some embodiments, the access transistor 110 may be a TFT. In other embodiments, the access transistor 110 may be not a TFT, e.g., a transistor formed on a crystalline semiconductor material provided in the backend of an IC structure using layer transfer. For example, in some such embodiments, the access transistor 110 may be a FinFET, a nanowire, or a nanoribbon transistor.

Figure 2A:
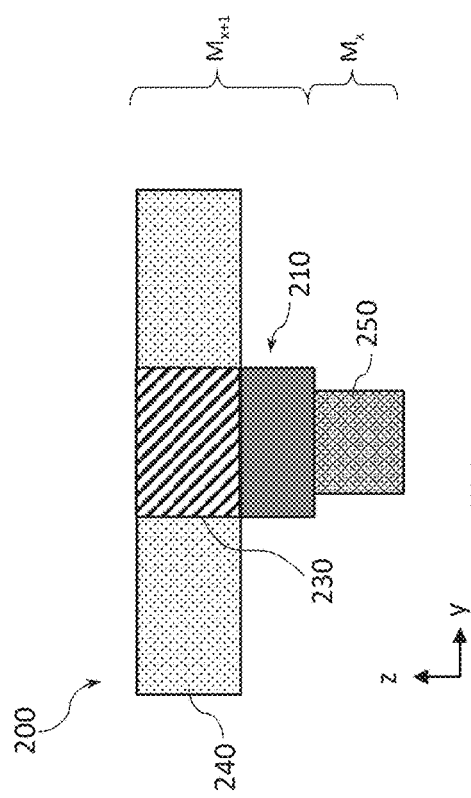
FIGS. 2A-2B are cross-sectional and plan views, respectively, of an example thin-film transistor (TFT) based memory cell with an access TFT, according to some embodiments of the present disclosure.
Figure 2B:
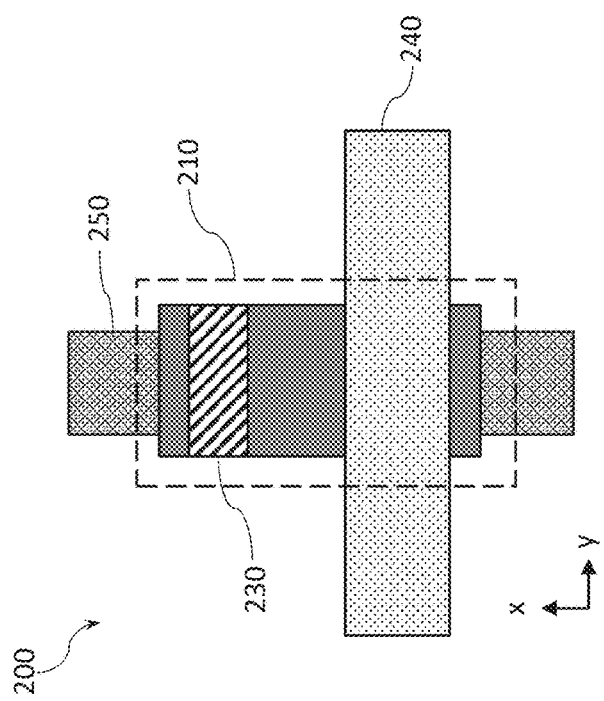

FIGS. 2A-2B are cross-sectional (y-z plane) and plan (y-x plane) views, respectively, of an example access TFT 210 of a given TFT-based memory cell 200, according to some embodiments of the present disclosure. For example, the access TFT 210 may be the access transistor 110 of FIG. 1, and the memory cell 200 may be the memory cell 100 of FIG. 1. FIGS. 3A-3B are cross-sectional views (x-z and y-z planes) of an example structure of the access TFT 210 in the TFT-based memory cell 200 of FIGS. 2A-2B, according to some embodiments of the present disclosure. The memory cell 200 shown in FIGS. 2 and 3 is an example of a memory cell that may be implemented to realize one or more of the memory cells of the backend memory of IC devices implementing bilayer stacking with compute logic circuits shared between bottom and top memory layers as described herein, e.g., of IC devices 400 or 500 as described herein. In some embodiments of the IC devices 400 or 500 as described herein, multiple memory cells 200 may be arranged in a stacked architecture, i.e., when different memory cells such as the one shown in FIGS. 2 and 3 are stacked in different memory layers of the first and second IC structures 401, 402 of the IC devices 400 or 500.

As shown in FIG. 2, the TFT-based memory cell 200 may include a WL 250 (which may be an example of the WL 150 of FIG. 1) to supply a gate signal. As also shown in FIG. 2, the TFT-based memory cell 200 may further include an access TFT 210 that includes a channel layer and is configured to control transfer of a memory state of the memory cell between a first region and a second region of the channel layer in response to the gate signal (channel layer and first and second regions described in greater detail below, e.g., with reference to FIG. 3). In some embodiments, the access TFT 210 may be provided above the WL 250 coupled to the memory cell 200. As also shown in FIG. 2, the memory cell 200 may further include a BL 240 to transfer the memory state and coupled to the first region of the channel layer of the access TFT 210, and a storage node 230 coupled to the second region of the channel layer of the access TFT 210. Although not specifically shown in FIG. 2, the memory cell 200 further includes a capacitor such as the capacitor 120 of FIG. 1, e.g., a metal-insulator-metal (MIM) capacitor coupled to the storage node 230 and configured to store the memory state of the memory cell 200.

Turning to the details of FIG. 2, the access TFT 210 in the memory cell 200 may be coupled to or controlled by WL 250, which, in some embodiments, may serve as the gate of the access TFT 210. A BL 240 (which may be an example of the BL 140 of FIG. 1) may be coupled to one of the S/D regions (or to one of the S/D contacts or terminals) of the access TFT 210 and a storage node 230 may be coupled to the other one of the S/D regions of the access TFT 210. In some embodiments, the BL 240 may serve as a first S/D contact (i.e., an electrically conductive structure for making a contact to a first S/D region of a transistor) and the storage node 230 may serve as the second S/D contact (i.e., an electrically conductive structure for making a contact to a second S/D region of a transistor) of the access TFT 210. The BL 240 may be connected to a sense amplifier and a BL driver which may, e.g., be provided in a memory peripheral circuit associated with a memory array that includes the memory cell 200. In some embodiments, for a given memory cell 200, the WL 250 may be formed in a metal layer Mx (where x is an integer indicating a specific layer) of the BEOL of an IC device, while the access TFT 210, the storage node 230, and the BL 240 may be formed in a metal layer Mx+1 of the BEOL of an IC structure, i.e., the metal layer above the metal layer Mx, e.g., directly above the metal layer Mx (as illustrated in FIGS. 2 and 3). A capacitor of the memory cell 200 may then be formed in a metal layer Mx+2 of the BEOL of an IC structure, e.g., directly above the metal layer Mx+1.

FIGS. 3A-3B illustrate further details of the access TFT 210. As shown in FIGS. 3A-3B, in some embodiments, the access TFT 210 may be provided substantially above the WL 250. In some embodiments, the access TFT 210 may be a bottom-gated TFT in that its gate stack comprising a gate dielectric 216 and a gate electrode 214 may be provided below its channel layer (also referred to as "active layer") 218, e.g., between the channel layer 218 and the WL 250, and the channel layer 218 may be between the gate stack and the BL 240 forming one of the S/D terminals, e.g., the drain terminal, of the access TFT 210 and the storage node 230 forming another one of the S/D terminals, e.g., the source terminal, of the access TFT 210 (again, in other embodiments, this example designation of S/D terminals may be reversed). Thus, e.g., for a b2b bonding of the IC structures 401 and 402 as described herein, for the memory layers of each of these IC structures, the WL 250 may be between a bonding interface 440 between the IC structures 401 and 402 (e.g., as shown in FIG. 4) and the gate electrode 214, and the BL 240 may be further away from the bonding interface 440 than the channel layer 218.

The channel layer 218 may be composed of semiconductor material systems including, for example, N-type or P-type materials systems. In some embodiments, the channel layer 218 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel layer 218 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel layer 218 may be formed of a thin-film material. Some such materials may be deposited at relatively low temperatures, which allows depositing them within the thermal budgets imposed on back end fabrication to avoid damaging the front end components such as the logic devices of the FEOL layer of an IC device 400 or 500. In some embodiments, the channel layer 218 may have a thickness between about 5 and 75 nanometers, including all values and ranges therein.

The S/D electrodes of the access TFT 210, shown in various figures as provided by the corresponding BL 240 and the storage node 230, respectively, may include any suitable electrically conductive material, alloy, or a stack of multiple electrically conductive materials. In some embodiments, the S/D electrodes of the access TFT 210 may include one or more metals or metal alloys, with metals e.g., copper, ruthenium, palladium, platinum, cobalt, nickel, hafnium, zirconium, titanium, tantalum, and aluminum, tantalum nitride, tungsten, doped silicon, doped germanium, or alloys and mixtures of these. In some embodiments, the S/D electrodes of the access TFT 210 may include one or more electrically conductive alloys, oxides, or carbides of one or more metals. In some embodiments, the S/D electrodes of the access TFT 210 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes of the access TFT 210 may have a thickness (i.e., dimension measured along the z-axis of the example coordinate system shown in the present drawings) between about 2 nanometers and 1000 nanometers, preferably between about 2 nanometers and 100 nanometers.

A gate dielectric 216 may laterally surround the channel layer 218, and the gate electrode 214 may laterally surround the gate dielectric 216 such that the gate dielectric 216 is disposed between the gate electrode 214 and the channel layer 218. In various embodiments, the gate dielectric 216 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric

216 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 216 during manufacture of the access TFT 210 to improve the quality of the gate dielectric 216. In some embodiments, the gate dielectric 216 may have a thickness between about 0.5 nanometers and 3 nanometers, including all values and ranges therein, e.g., between about 1 and 3 nanometers, or between about 1 and 2 nanometers.

In some embodiments, the gate dielectric 216 may be a multilayer gate dielectric, e.g., it may include any of the high-k dielectric materials in one layer and a layer of IGZO. In some embodiments, the gate stack (i.e., a combination of the gate dielectric 216 and the gate electrode 214) may be arranged so that the IGZO is disposed between the high-k dielectric and the channel layer 218. In such embodiments, the IGZO may be in contact with the channel layer 218, and may provide the interface between the channel layer 218 and the remainder of the multilayer gate dielectric 216. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate electrode 214 may include at least one P-type work function metal or N-type work function metal, depending on whether the access TFT 210 is a P-type metal oxide semiconductor (PMOS) transistor or an N-type metal oxide semiconductor (NMOS) transistor. For a PMOS transistor, metals that may be used for the gate electrode 214 may include, but are not limited to, ruthenium, palladium, platinum, cobalt, nickel, and conductive metal oxides (e.g., ruthenium oxide). For an NMOS transistor, metals that may be used for the gate electrode 214 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 214 may include a stack of two or more metal layers, where one or more metal layers are work function metal layers and at least one metal layer is a fill metal layer. Further metal layers may be included for other purposes, such as to act as a diffusion barrier layer, described below.

FIGS. 3A-3B further illustrate that the bottom-gated access TFT 210 may further, optionally, include layers such as a diffusion barrier layer 212, which may be surrounded by a layer of etch-resistant material (e.g., an etch-stop layer 211). In some embodiments, the diffusion barrier 212 may be a metal- or copper-diffusion barrier (e.g., a conductive material to reduce or prevent the diffusion of metal or copper from WL 250 into the gate electrode 214 while still maintaining an electrical connection between the WL 250 and the gate electrode 214) on the WL 250 such as TaN, tantalum (Ta), titanium zirconium nitride (e.g., $TiXZr1-XN$, such as X=0.53), titanium nitride (e.g., TiN), titanium tungsten (TiW), combination (such as a stack structure of TaN on Ta), or the like. For instance, the diffusion barrier 212 can include a single- or multilayer structure including a compound of tantalum (Ta) and nitrogen (n), such as TaN or a layer of TaN on a layer of Ta. In some embodiments, a layer of an etch-resistant material (e.g., the etch-stop 211) such as silicon nitride or silicon carbide may be formed over the WL 250 with vias for a metal (or copper) diffusion barrier film 212 such as TaN or a TaN/Ta stack. The gate electrode 214 can be a conductive material on the diffusion barrier 212, such as metal, conductive metal oxide or nitride, or the like. For example, in one embodiment, the gate electrode 214 may be titanium nitride (TiN). In another embodiment, the gate electrode 214 may be tungsten (W).

The channel layer 218 can be in contact with the BL 240 (e.g., at a first S/D region of the channel layer 218, e.g., a source region) and with the storage node 230 (e.g., at a second S/D region of the channel layer 218, e.g., a drain region, with a semiconducting channel region of the access TFT 210 being between the first S/D region and the second S/D region). In some embodiments, such a channel region may include only majority carriers in the thin film. Accordingly, in some embodiments, the channel layer 218 may require a relatively high bias (as e.g., supplied by the WL 250, diffusion barrier film 212, and gate electrode 214) to activate.

FIGS. 4A-4C provide schematic illustrations of IC devices 400 (labeled in individual ones of FIGS. 4A-4C as IC devices 400A, 400B, and 400C, respectively) implementing bilayer memory stacking with compute logic circuits shared between bottom and top memory layers, according to various embodiments of the present disclosure.

As shown in FIG. 4A, the IC device 400A may include a first IC structure 401 and a second IC structure 402, bonded together, where a bonding interface between respective faces of the first and second IC structures 401, 402 is illustrated in FIG. 4A as a bonding interface 440-12. As further shown in FIG. 4A, the first IC structure 401 may include at least a memory layer 430-1, while the second IC structurer 402 may include at least a stack of a compute logic layer 420-2 and a memory layer 430-2.

In some embodiments, the memory layers 430 may be backend memory layers, e.g., the memory layer 430-1 may be implemented in the BEOL layer of the first IC structure 401 and the memory layer 430-2 may be implemented in the BEOL layer of the second IC structure 402, while the compute logic layer 420-2 may be implemented in the FEOL layer of the second IC structure 402. In such embodiments, the memory layer 430-2 may include TFT-based memory and/or backend memory implemented using layer transfer, as described above. On the other hand, the compute logic layer 420-2 may include frontend/FEOL devices, e.g., frontend transistors such as FinFETs, nanowire transistors, nanoribbon transistors, etc. In some embodiments, some or all of the frontend transistors of the compute logic layer 420-2 may be implemented as transistors with back-side contacts. In some embodiments, some or all of the frontend transistors of the compute logic layer 420-2 may be implemented as transistors with front-side contacts. In general, a transistor is described as a transistor with front-side contacts if both S/D contacts of the transistor are on one side of a channel material of the transistor, above the channel material of the transistor. On the other hand, a transistor is described as a transistor with back-side contacts if either both S/D contacts of the transistor are below the channel material of the transistor or if one S/D contact is on one side with respect to the channel material (e.g., above the channel material) and the other S/D contact is on the opposite side (e.g., below the channel material).

In some embodiments of the IC device 400A, the compute logic layer 420-2 may be provided in the FEOL and in one or more lowest metal layers of the BEOL of the second IC structure 402, while one or more backend memory arrays of the memory layer 430-2 may be provided in higher layers of the BEOL of the second IC structure 402. In some embodiments of the IC device 400A, compute logic devices described with reference to the compute logic layer 420-2 may also be provided above the compute logic layer 420-2 (e.g., in the memory layer 430-2), in between memory layers 430-2 of the BEOL of the second IC structure 402, or combined with the memory layers of the memory layer 430-2. In some embodiments of the IC device 400A, the memory layer 430-1 may be provided in the FEOL and in any number of the metal layers of the BEOL of the first IC structure 401.

Each of the memory layers 430 may include at least one layer of backend memory, e.g., a memory array with a plurality of 1T-1C memory cells as described herein, e.g., memory cells 100/200 as described herein, or a stack of such layers/arrays. In addition, each of the memory layers 430 may further include a plurality of backend interconnects configured to electrically couple one or more of the plurality of memory cells of the backend memory of the memory layers 430 to (e.g., by being in electrically conductive contact with at least portions of) one or more of the plurality of frontend devices of the compute logic layer 420-2. In particular, even though originally the second IC structure 402 may be such that the frontend devices of the compute logic layer 420-2 are coupled to only the memory cells of the memory layer 430-2 that is provided in the second IC structure 402, when the second IC structure 402 is bonded with the first IC structure 401 the bonding may be such that the frontend devices of the compute logic layer 420-2 are further coupled to the memory cells of the memory layer 430-1 that is provided in the first IC structure 401. In this manner, the functionality of the frontend devices of the compute logic layer 420-2 may be shared between the memory cells of the memory layer 430-2 and the memory cells of the memory layer 430-1, thus realizing bilayer memory stacking with compute logic circuits of the compute logic layer 420-2 being shared between a bottom memory layer (e.g., the memory layer 430-1) and a top memory layer (e.g., the memory layer 430-2).

In some embodiments, the frontend transistors implemented in the compute logic layer 420-2 may be a part of compute logic, e.g., to serve as a memory peripheral circuit for the memory arrays implemented in the memory layers 430 of the first and second IC structures 401, 402. For example, the frontend transistors may be responsible for compute logic functionality related to read/write operations with respect to the data stored in the memory cells that may be implemented in the memory layer 430-2 and the memory layer 430-1. To that end, some of the frontend transistors of the compute logic layer 420-2 may be part of one or more input/output (I/O) ICs (e.g., a memory peripheral circuit) configured to control (e.g., control access (read/write), store, refresh) the memory cells implemented in the IC device 400A (e.g., memory cells implemented in the memory layers 430 of the first and second IC structures 401, 402). In some embodiments, some of the frontend transistors of the compute logic layer 420-2 may be part of high-performance compute logic, configured to perform various operations with respect to data stored in the memory layers 430 of the IC device 400A (e.g., arithmetic and logic operations, pipelining of data from one or more of the memory arrays implemented in the IC device 400A, and possibly also data from external devices/chips).

Various interconnect layers of the compute logic layer(s) 420 and the memory layers 430 may be/include metal layers of respective metallization stacks of the individual IC structures bonded together to form the IC device 400A (e.g., the IC structures 401, 402 as shown in FIG. 4A). Various metal layers of the individual IC structures bonded together to form the IC device 400A may be used to interconnect the various inputs and outputs of the logic devices in the compute logic layer 420-2 and/or of the memory cells in the memory layers 430. Generally speaking, each of the metal layers of the individual IC structures of the IC device 400A may include a via portion and a trench/interconnect portion. The trench portion of a metal layer is configured for transferring signals and power along electrically conductive (e.g., metal) lines (also sometimes referred to as "trenches") extending in the x-y plane (e.g., in the x or y directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of another (e.g., an adjacent) metal layer. While referred to as "metal" layers, various layers of the individual IC structures of the IC device 400A may include only certain patterns of conductive metals, e.g., copper (Cu), aluminum (Al), tungsten (W), or cobalt (Co), or metal alloys, or more generally, patterns of an electrically conductive material, formed in an insulating medium such as an ILD. The insulating medium may include any suitable ILD materials such as silicon oxide, carbon-doped silicon oxide, silicon carbide, silicon nitride, aluminum oxide, and/or silicon oxynitride.

Figure 7:
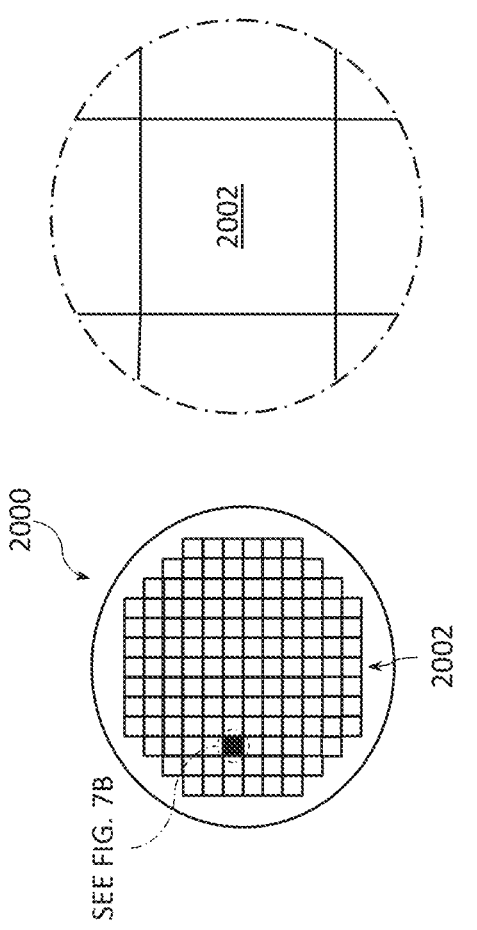
FIGS. 7A-7B are top views of a wafer and dies that may include one or more pairs of memory arrays stacked using bilayer stacking with compute logic circuits shared between bottom and top memory layers in accordance with any of the embodiments disclosed herein.

The memory layer 430-1 of the first IC structurer 401 may originally be provided over a first support structure, while the compute logic layer 420-2 and the memory layer 430-2 of the second IC structure 402 may originally be provided over a second support structure. Each of such first and second support structures may be a substrate, a die, a wafer, or a chip. In some embodiments, any of the support structures over which the compute logic layers 420 and the memory layers 430 as described herein may be built may be a semiconductor support structure, e.g., a semiconductor substrate, composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the substrate may be a printed circuit board (PCB) substrate. Although a few examples of materials from which the substrate may be formed are described here, any material that may serve as a foundation upon which the compute logic layers 420 and the memory layers 430 as described herein may be built falls within the spirit and scope of the present disclosure. In various embodiments, channel materials of the frontend transistors of the compute logic layer 420-2 may include, or may be formed upon, any such substrate material of the support structure of the IC structure 402. In some embodiments, each of such support structures of the individual IC structures of the IC device 400 may, e.g., be the wafer 2000 of FIG. 7A, discussed below.

While memory layer 430-1 of the first IC structurer 401 and the compute logic layer 420-2 and the memory layer 430-2 of the second IC structure 402 may originally be provided over respective support structures, one or both of these support structure may subsequently be removed or at least thinned down, prior to bonding the first and second IC structures 401, 402 together. For example, the support structure of the second IC structure 402 may be removed prior to bonding with the first IC structure 401 to expose the back-side portions (e.g., S/D regions) of the frontend devices of the compute logic layer 420-2 so that direct electrical connections may be made to those portions, through the bonding interface 440-12, from the memory cells of the memory layer 430-1. Similarly, the support structure of the first IC structure 401 may be removed prior to bonding with the second IC structure 402 to expose the back-side portions of the interconnects or memory cells of the memory layer 430-1 so that direct electrical connections may be made to those portions, through the bonding interface 440-12, from the frontend devices of the compute logic layer 420-2 and/or the memory cells of the memory layer 430-2. Such embodiments may be particularly advantageous for b2b bonding of the IC structures 401 and 402. However, in other embodiments, one or more of the support structure of the second IC structure 402 and the support structure of the first IC structure 401 may be only thinned down, or even left as-is (i.e., without thinning it down), prior to bonding these IC structures, and vias or, more generally, through-support structure interconnects may be provided to electrically couple components of the IC structures 401, 402 through the bonding interface 440-12. Still further, in further embodiments, the IC structures 401 and 402 may be bonded in a front-to-back (f2b) arrangement, where a front side of the IC structure 401 is bonded to the back side of the IC structure 402. In such embodiments, each of the support structures of the IC structures 401 and 402 may be removed, thinned down, or left as-is, depending on the particular design.

In general, bonding of the IC structures 401, 402 may be performed as follows. First, the IC structures 401 and 402 may be fabricated individually. In some embodiments, they may (but do not have to) be fabricated at different manufacturing facilities, by different companies, etc. After that, one face of the IC structure 401 and one face of the IC structure 402 may be bonded. In some embodiments, bonding of the faces of the IC structures 401 and 402 may be performing using insulator-insulator bonding, e.g., as oxide-oxide bonding, where an insulating material of the IC structure 401 is bonded to an insulating material of the IC structure 402. In some embodiments, a bonding material may be present between at least portions of the faces of the IC structures 401 and 402 that are bonded together. To that end, a bonding material may be applied to at least portions of the one or both faces of the IC structures 401 and 402 that should be bonded and then the IC structures 401 and 402 are put together, possibly while applying a suitable pressure and heating up the assembly to a suitable temperature (e.g., to moderately high temperatures, e.g., between about 50 and 200 degrees Celsius) for a duration of time. In some embodiments, such a bonding material may be an adhesive material that ensures attachment of the IC structures 401 and 402 to one another. In some embodiments, such a bonding material may be an etch-stop(ES) material. In some embodiments, the bonding material may be both an ES material and have suitable adhesive properties to ensure attachment of the IC structures 401 and 402 to one another. Thus, in some embodiments, the bonding material may be the bonding interface 440 (e.g., the bonding interface 440-12 shown in FIG. 4A). In other embodiments, no bonding material may be used, in which case the layer labeled "440" in the present drawings may represent a bonding interface 440 resulting from the bonding of the IC structures 401 and 402 to one another. Such a bonding interface may be recognizable as a seam or a thin layer in the IC devices 400A, using, e.g., selective area diffraction (SED), even when the specific materials of the insulators of the IC structures that are bonded together may be the same, in which case the bonding interface would still be noticeable as a seam or a thin layer in what otherwise appears as a bulk insulator (e.g., bulk oxide) layer. As used herein, unless specified otherwise, references to the "bonding material" are applicable to a "bonding interface" for the embodiments where no deliberately added adhesive material is used to bond the IC structures of the IC device 400A.

FIG. 4A further illustrates that, in some embodiments, the second IC structure 402 may further include a power and/or signal layer 450-2, e.g., provided at the front of the second IC structure 402, so that the memory layer 430-2 is between the power and/or signal layer 450-2 and the compute logic layer 420-2. However, in other embodiments, a similar power and/or signal layer 450 may be provided in the first IC structure 401 (in which case it may be referred to as a "power and/or signal layer 450-1"), e.g., so that the memory layer 430-1 is between the power and/or signal layer 450-1 and the bonding interface 440-12, and/or respective power and/or signal layers 450 may be provided in both of the IC structures 401, 402. In general, the power and/or signal layer 450 represents any collection of interconnects for routing power and/or signals to any of the components of the IC structures of the IC device 400A. In various embodiments, power and signals may be provided from the same or different sides of the IC device 400A.

While FIG. 4A illustrates an example of the IC device 400 where only two IC structures 401, 402 are bonded together, in further embodiments, the IC device 400 may include additional IC structures bonded thereto. For example, FIG. 4B illustrates an IC device 400B that includes the IC structures 401, 402 bonded together with the bonding interface 440-12, as described with reference to FIG. 4A, and further includes a third IC structure 403 bonded to the other face of the first IC structure 401 (i.e., to the face of the first IC structure 401 that is not bonded to the second IC structure 402) with a bonding interface 440-31. If the IC structures 401, 402 are bonded together in a b2b arrangement, then the IC structures 403, 401 may be bonded in a front-to-front (f2f) arrangement, where the front of the IC structure 403 is bonded to the front of the IC structure 401, as is illustrated in FIG. 4B, or in a b2f arrangement, where the back of the IC structure 403 is bonded to the front of the IC structure 401 (not specifically shown in the present drawings).

As shown in FIG. 4B, in some embodiments, the third IC structure 403 may include a stack of a compute logic layer 420-3 and a memory layer 430-3, where bonding may be a f2f bonding such that the memory layer 430-3 is between the bonding interface 440-31 and the compute logic layer 420-3. In general, the compute logic layer 420-3 and the memory layer 430-3 may be implemented similar to the compute logic layer 420-2 and the memory layer 430-2 of the second IC structure 402, described above. In some embodiments, functionality and/or performance of the compute logic layers 420-2 and 420-3 may be different, e.g., the compute logic layer 420-3 may include devices specifically designed for high-voltage applications, whereas the compute logic layer 420-2 may include devices designed for lower-voltage applications. In such embodiments, transistors of the compute logic layer 420-3 may have thicker gate dielectrics than transistors of the compute logic layer 420-2 (to allow them to operate in high-voltage applications).

Bonding of the IC structures 403, 401 may be performed in a manner similar to that described for bonding of the IC structures 401, 402, and the descriptions provided with respect to the bonding interface 440-12 are applicable to the bonding interface 440-31 or any other bonding interface between different IC structures of the IC device 400 bonded together.

While FIG. 4B illustrates an example where the IC structure 403 is bonded to the IC structure 401, in other embodiments, the IC structure 403 may be bonded to the IC structure 402 instead. In yet other embodiments, the IC structure 403 may be bonded to the IC structure 401 while another IC structure may be bonded to the IC structure 402. Furthermore, while FIG. 4B illustrates that the IC structure 403 includes the compute logic layer 420-3 and the memory layer 430-3, in other embodiments of the IC devices 400, the IC structure 403 as described herein may include only the compute logic layer 420-3 but not the memory layer 430-3 or may include only the memory layer 430-3 but not the compute logic layer 420-3.

FIG. 4C provides yet another illustration of an example of the IC device 400, where an additional support structure may be provided on one or both sides of the IC device 400 after the individual IC structures are bonded together. An IC device 400C, shown in FIG. 4C, is similar to the IC device 400A, described above, except that it further illustrates an additional support structure 405-1 attached to the IC structure 401, and an additional support structure 405-2 attached to the IC structure 402. In other embodiments, only one of the additional support structures 405 may be provided in the IC device 400, and/or the individual IC structures bonded together may include any other combination of two or more IC structures as described herein. In general, the additional support structures 405 may be used to provide mechanical support and/or help routing power and/or signals to any of the components of the IC structures bonded together in the IC device 400. To that end, any of the additional support structures 405 may include a through-substrate vias (TSVs) extending all the way through the additional support structure 405 and terminating on any of power and/or signal lines of the individual IC structured bonded together in the IC device 400, and/or on any of the components of the individual IC structured bonded together in the IC device 400. Some examples of such TSVs are shown in some of the drawings of FIG. 5 and described in greater detail below. The additional support structures 405 are different from the support structures over which the compute logic layers 420 and/or memory layers 430 are built, described above, in that they are provided in the IC device 400 after the individual IC structures 401, 402, etc. have been bonded together. However, in general, the additional support structures 405 may include any of the materials described above with reference to the support structures over which the compute logic layers 420 and/or memory layers 430 are built.

FIGS. 5A-5K provide cross-sectional views of example IC devices 500 implementing bilayer memory stacking with compute logic circuits shared between bottom and top memory layers, according to various embodiments of the present disclosure. A number of elements labeled in FIG. 5 and in at least some of the subsequent figures with reference numerals are illustrated in these figures with different patterns, with a legend showing the correspondence between the reference numerals and patterns being provided at the bottom of each drawing page containing these figures. For example, the legend illustrates that FIG. 5 uses different patterns to show frontend devices 504, an ILD material 506, interconnects 508, etc. Various ones of the IC devices 500 shown in FIGS. 5A-5K provide various example implementations of the IC devices 400 as shown in FIGS. 4A-4C, which is indicated in FIGS. 5A-5K by using the same reference numerals as those used in FIGS. 4A-4C to illustrate different portions/components of the IC devices 500. For example, FIGS. 5A-5K illustrate the first IC structure 401, the second IC structure 402, the bonding interface 440-12, and so on. Unless specified otherwise, descriptions of these portions/components provided with reference to the IC devices 400 are applicable to the IC devices 500, and are not repeated here, and only specific features intended to be highlighted in the examples of FIGS. 5A-5K are described.

The IC device 500A, shown in FIG. 5A, may be an example implementation of the IC device 400A where the IC structures 401 and 402 are bonded in a b2b arrangement. The b2b arrangement is seen in FIG. 5A because a back side 534-1 of the IC structure 401 is bonded to a back side 534-1 of the IC structure 402 (i.e., in the IC device 500A, the bonding interface 440-12 is between the back sides 534-1 of the IC structures 401 and 402), with the front sides 534-2 of the IC structures 401 and 402 facing in the opposite directions of the IC device 500A. As used herein, a "back side 534-1" of an IC structure refers to the side of the IC structure that is at the bottom when various circuits (e.g., circuits of the compute logic layer 420 and/or the memory layer 430) are being formed on the IC structure from the top side, while a "front side 534-2" of an IC structure refers to the side of the IC structure that is at the top once various circuits have been formed.

As shown in FIG. 5A, in some embodiments, the compute logic layer 420-2 may include frontend device 504, e.g., frontend transistors. The details of the frontend devices 504 are not shown in FIG. 5A because various architectures of such devices are known in the art. In various embodiments, the frontend devices 504 may include transistors of any architecture, or any combinations of architectures, as known in the art. The channel materials of the frontend devices 504 may include a semiconductor material that may originally be a portion of the support structure of the IC structure 402, which may later be removed, as is shown for the example of FIG. 5A.

In some embodiments, the channel material of the frontend devices 504 of the compute logic layer 420-2 may be composed of semiconductor material systems including, for example, N-type or P-type materials systems. In some embodiments, the channel material of the frontend devices 504 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material of the frontend devices 504 may include a combination of semiconductor materials where one semiconductor material may be used for the channel portion and another material, sometimes referred to as a "blocking material," may be used between the channel portion and the support structure over which the frontend transistors are provided. In some embodiments, the channel material of the frontend devices 504 may include a monocrystalline semiconductor, such as silicon (Si) or germanium (Ge). In some embodiments, the channel material of the frontend devices 504 may include a compound semiconductor with a first sub-lattice of at least one element from group Ill of the periodic table (e.g., Al, Ga, In), and a second sub-lattice of at least one element of group V of the periodic table (e.g., P, As, Sb).

For some example N-type transistor embodiments (i.e., for the embodiments where a given frontend device 504 is an NMOS transistor), the channel portion of the frontend device 504 may advantageously include a III-V material having a high electron mobility, such as, but not limited to InGaAs, InP, InSb, and InAs. For some such embodiments, the channel portion may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion may be an intrinsic III-V material, i.e., a III-V semiconductor material not intentionally doped with any electrically active impurity. In alternate embodiments, a nominal impurity dopant level may be present within the channel portion, for example to further fine-tune a threshold voltage Vt, or to provide HALO pocket implants, etc. Even for impurity-doped embodiments however, impurity dopant level within the channel portion of the frontend devices 504 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where a given frontend device 504 is a PMOS transistor), the channel portion of the frontend device 504 may advantageously be a group IV material having a high hole mobility, such as, but not limited to Ge or a Ge-rich SiGe alloy. For some example embodiments, the channel portion may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the frontend devices 504, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

FIG. 5A illustrates an ILD material 506 and a plurality of interconnects 508 above the frontend devices 504. In various embodiments, the ILD material 506 may include any suitable ILD materials such as silicon oxide, carbon-doped silicon oxide, silicon carbide, silicon nitride, aluminum oxide, and/or silicon oxynitride. In various embodiments, the ILD material 506 may include a low-k dielectric material. Examples of the low-k dielectric materials that may be used as the ILD material 506 include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the ILD material 506 include organic polymers such as polyimide, polynorbornenes, benzocyclobutene, perfluorocyclobutane, or polytetrafluoroethylene (PTFE). Still other examples of low-k dielectric materials that may be used as the ILD material 506 include silicon-based polymeric dielectrics such as hydrogen silsesquioxane (HSQ) and methylsilsesquioxane (MSQ). Other examples of low-k materials that may be used in the ILD material 506 include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. In various embodiments, the interconnects 508 may include any suitable electrically conductive material, alloy, or a stack of multiple electrically conductive materials. In some embodiments, various electrically conductive materials described herein may include one or more metals or metal alloys, with metals such as copper, ruthenium, palladium, platinum, cobalt, nickel, hafnium, zirconium, titanium, tantalum, molybdenum, tungsten and aluminum. In some embodiments, various electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide), or nitrides (e.g., hafnium nitride, zirconium nitride, titanium nitride, tantalum nitride, and aluminum nitride) of one or more metals.

Figure 5K:
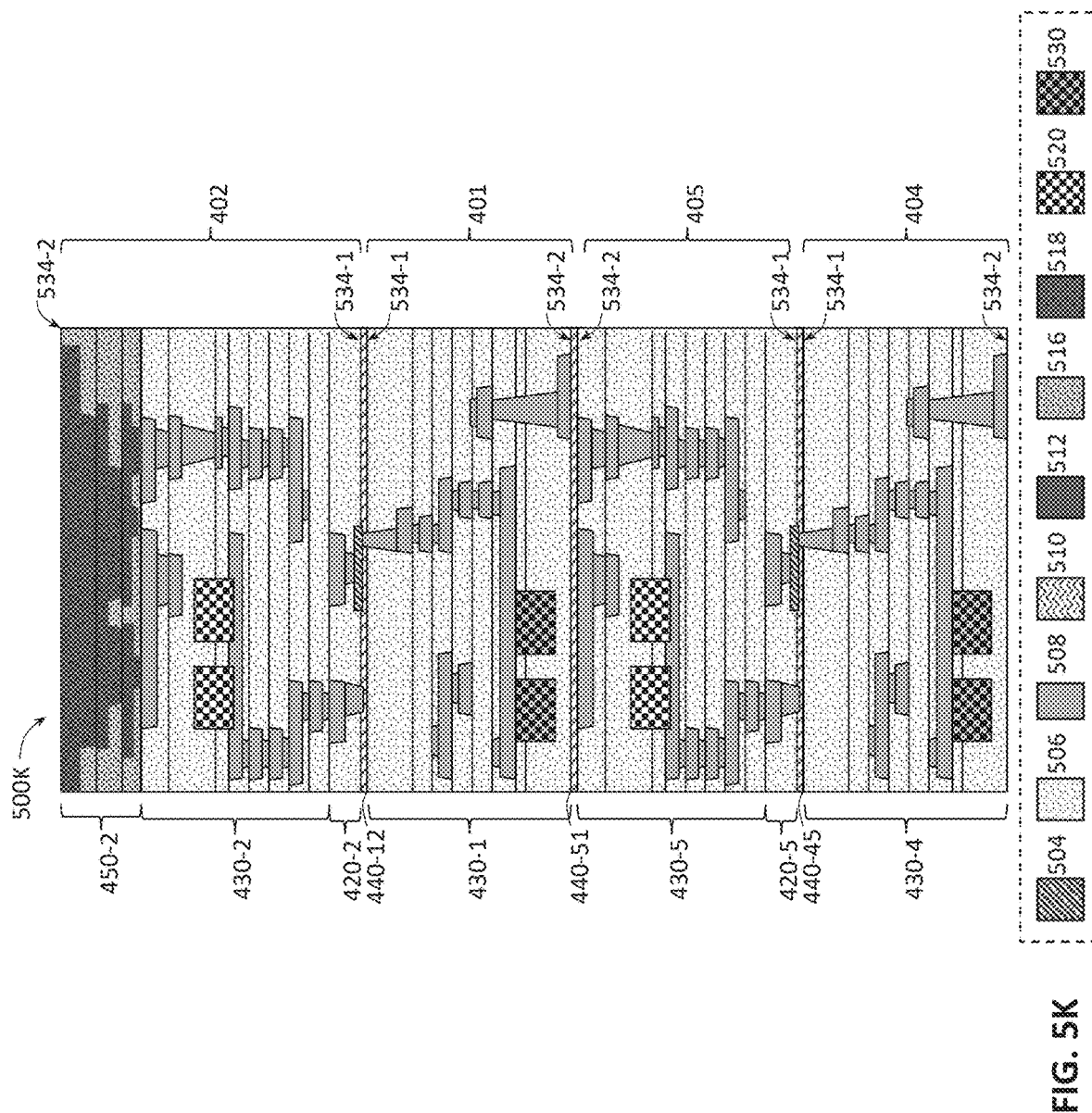

A portion of the ILD material 506 directly above and surrounding portions of the frontend devices 504, and one or more of the interconnects 508 in that portion of the ILD material 506 may be seen as a part of the compute logic layer 420-2, whereas everything above, up to the layer 450-2, may be seen as a part of the memory layer 430-2, as labeled in FIG. 5A. In particular, the memory layer 430-2 may include a metallization stack of a plurality of metal layers labeled in FIG. 5A as a metal layer 1 (M1), a metal layer 2 (M2), and so on. A layer of an ES material may be present between at least portions of adjacent metal layers of the IC structure 402 (and of other IC structures illustrates in FIGS. 5A-5K), as known in the art, the layers of ES materials illustrated in FIGS. 5A-5K as horizontal black lines extending across the entire width of the cross-sectional sides views of the IC devices 500 shown in these drawings.

In some embodiments, even when only a single layer of backend memory cells is implemented in a given IC structure, the backend memory may occupy a plurality of consecutive metal layers of the metallization stack of an IC device. This is shown in FIG. 5A with the backend memory of the memory layer 430-2 being in the metal layers M5, M6, and M7. In particular, FIG. 5A illustrates access transistors 510, S/D contacts 512 for the access transistors 510, and capacitors 514. FIG. 5A further provides a label for one example memory cell 520, illustrated in FIG. 5A within a dashed rectangular contour, that includes one access transistor 510 and one capacitor 514, coupled to one of the S/D contacts 512 of the access transistor 510. Thus, the memory cell 520 is an example of a 1T-1C memory cell, e.g., the memory cell 100 as described above, where the access transistor 510 is an example of the access transistor 110, and the capacitor 514 is an example of the capacitor 120, described above. In particular, the access transistor 510 is a backend transistor and the memory cell 520 is a backend memory cell. Two such memory cells 520 are shown in the memory layer 430-2 shown in FIG. 5A, but only one is labeled with reference numeral in order to not clutter the drawing. The memory cell 520 may be a backend memory cell according to any of the embodiments described above, e.g., an eDRAM memory cell as explained with reference to FIGS. 1-3. For example, as shown in FIG. 5A for the memory layer 430-2, in some embodiments of the memory cell 520, one of the interconnects 508 in a metal layer M5 may form a WL such as the WL 250, described above, while the access transistor 510, a storage node such as the storage node 230, and a BL such as the BL 240 may be formed in a metal layer M6 of the BEOL in which the memory layer 430-2 is provided (i.e., the metal layer directly above the metal layer M5), and the capacitor 514 may then be formed in a metal layer M7 (i.e., the metal layer directly above the metal layer M6). FIG. 5A further illustrates a PL such as the PL 160, described above, which may be coupled to one of the interconnects 508 in the metal layer M7. In other embodiments of the IC device 500A, backend memory of the memory layer 430-2 with memory cells as the memory cell 520 may be implemented in other metal layers of the BEOL of the second IC structure 402, any number of memory cells 520 may be included in a given layer/array of backend memory cells, and multiple layers of backend memory cells such as the memory cell 520 may be stacked over one another, thus implementing three-dimensional (3D) stacked backend memory in the IC structure 402.

Turning to the memory cells that may be implemented in the memory layer 430-1, FIG. 5A illustrates one example memory cell 530 (within a dashed rectangular contour). Two such memory cells 530 are shown in the memory layer 430-1 shown in FIG. 5A, but only one is labeled with reference numeral in order to not clutter the drawing. In other embodiments of the IC device 500A, backend memory of the memory layer 430-1 with memory cells as the memory cell 530 may be implemented in other metal layers of the BEOL of the first IC structure 401, any number of memory cells 530 may be included in a given layer/array of backend memory cells, and multiple layers of backend memory cells such as the memory cell 530 may be stacked over one another, thus implementing 3D stacked backend memory in the IC structure 401.

Although individual parts of the memory cell 530 are not specifically labeled in FIG. 5A in order to not clutter the drawing, examination of the memory cell 530 reveals that it is substantially the same as the memory cell 520 of the memory layer 430-2 (thus, the memory cell 530 is also an example of a 1T-1C memory cell, e.g., the memory cell 100 as described above), except that it is provided upside down with respect to the memory cells 520, as a result of the b2b bonding of the IC structures 401 and 402. This means that, while both the memory cells 520 and the memory cells 530 may be fabricated with access transistors that are bottom-gated transistors, once the IC structures 401 and 402 are bonded in a b2b bonding, the memory cells of one of the IC structures still have bottom-gated transistors but the memory cells of the other one of the IC structures are flipped upside down and, therefore, have top-gated access transistors. For the example shown in FIG. 5A, the access transistors of the memory cells 530 of the first memory layer 430-1 may be considered to be top-gated transistors in that a gate electrode of these access transistors (and the associated WL) is closer to the bonding interface 440-12 than the channel material of these transistors, and the S/D contacts to these transistors are further away from the bonding interface 440-12 than the channel material of these transistors. On the other hand, the access transistors of the memory cells 520 of the second memory layer 430-2 may be considered to be bottom-gated transistors in that a gate electrode of these access transistors (and the associated WL) is closer to the bonding interface 440-12 than the channel material of these transistors, and the S/D contacts to these transistors are further away from the bonding interface 440-12 than the channel material of these transistors. Although FIG. 5A illustrates that the memory cells 520 and 530 have both S/D contacts on one side of their respective channel material, and on the side opposite of where the gate contact is provided, in other embodiments, one of the S/D contacts may be on the same side with the gate contact.

Another feature characteristic of the b2b bonding of the IC structures 401 and 402 may be seen in the IC device 500A by analyzing cross-sections of various interconnects included in these structures (e.g., interconnects includes in the memory layers 430-1 and 430-2). In particular, for certain fabrication processes (e.g., dual-Damascene or single-Damascene processes), cross-sectional shapes of various interconnects in the plane such as that shown in FIG. 5A may be trapezoidal, i.e., a cross-section of a given interconnect may have two sides that are substantially parallel, one of which is a short side and another one of which is a long side (i.e., one of the substantially parallel sides is shorter than the other). Because the respective interconnects of the IC structures 401 and 402 are formed on different substrates before the IC structures 401 and 402 are bonded together with their back sides 534-1 facing one another, in the IC device 500A, for each trapezoid of the interconnects of the IC structure 401, and for each trapezoid of the interconnects of the IC structure 402, the short side is closer to the bonding interface 440-12 than the long side. Phrased differently, when the IC structures 401 and 402 are bonded together with their back sides 534-1 facing one another and the IC structure 401 is the one being at the bottom of the IC device, as is shown in FIG. 5A, for each trapezoid of the interconnects of the IC structure 401, the long side is closer to bottom of the IC device 500A, represented by the front side 534-2 of the IC structure 401, than the short side. On the other hand, for each trapezoid of the interconnects of the IC structure 402, the short side is closer to bottom of the IC device 500A than the long side.

FIG. 5A further illustrates the power and/or signal layer 450-2 being a part of the IC structure 402 in the IC device 500A, although it could be implemented differently in other embodiments, as described above. As shown in FIG. 5A, in general, a power and/or signal layer 450, implemented anywhere in the IC device 500, may include an insulator 516 and a plurality of power and/or signal interconnects 518 that may be coupled to any of the memory cells 520 of the backend memory implemented in the IC device 500A and/or to any of the components (e.g., the frontend devices 504) of the compute logic layer 420-2 in order to communicate power and/or signals to/from/between these components. The interconnects 518 may include any suitable interconnect structures, such as trench structures and/or via structures, e.g., as described below with reference to the interconnect structures 2128, shown in FIG. 8. In some embodiments, the interconnects 518 may be arranged within multiple metal layers to route power and/or electrical signals according to a wide variety of designs (in particular, the arrangement is not limited to the particular configuration of the interconnects 518 depicted in FIG. 5A or other drawings). Although a particular number of interconnect layers in which the interconnects 518 are disposed is depicted in FIG. 5A and in other drawings, embodiments of the present disclosure include IC devices having more or fewer interconnect layers with the interconnects 518 than depicted. The same applies to other metal layer depicted in FIG. 5A and other drawings. Various metal layers of the IC devices 500 may be similar to the interconnect layers 2106-2110 shown in FIG. 8. Examining the orientation of the trapezoidal cross-sections of the interconnects 518 in a given IC device 500 may also reveal features indicative of the type of bonding of the different IC structures, similar to how it was explained above with reference to the trapezoidal cross-sections of the interconnects in the memory layers 430-1 and 430-2.

FIG. 5B illustrates an IC device 500B that is similar to the IC device 500A, described above, except that the IC structures 401 and 402 are bonded in a f2b arrangement. This is shown in FIG. 5B by the bonding interface 440-12 being between the front side 534-2 of the IC structure 401 and the back side 534-1 of the IC structure 402. As a result, different from the IC device 500A of FIG. 5A, in the IC device 500B, the memory cells 530 are oriented the same way and not upside down with respect to the memory cells 520. For example, when both the memory cells 520 and the memory cells 530 are fabricated with access transistors that are bottom-gated transistors, once the IC structures 401 and 402 are bonded in a f2b bonding, the memory cells of both of the IC structures still have bottom-gated transistors. Similar to the embodiment shown in FIG. 5A, although FIG. 5B illustrates that the memory cells 520 and 530 have both S/D contacts on one side of their respective channel material, and on the side opposite of where the gate contact is provided, in other embodiments, one of the S/D contacts may be on the same side with the gate contact. Another feature characteristic of the f2b bonding of the IC structures 401 and 402 may be seen in the IC device 500B by analyzing cross-sections of various interconnects included in these structures (e.g., interconnects includes in the memory layers 430-1 and 430-2). In particular, in the IC device 500B, for each trapezoid of the interconnects of the IC structure 402, the short side is closer to the bonding interface 440-12 than the long side, while, for each trapezoid of the interconnects of the IC structure 401, the long side is closer to the bonding interface 440-12 than the short side. Phrased differently, when the IC structures 401 and 402 are bonded together with the back side 534-1 of the IC structure 402 facing the front side 534-2 of the IC structure 401 and the IC structure 401 is the one being at the bottom of the IC device, as is shown in FIG. 5B, for each trapezoid of the interconnects of the IC structure 401, and for each trapezoid of the interconnects of the IC structure 402, the short side is closer to bottom of the IC device 500B, represented by the back side 534-1 of the IC structure 401, than the long side.

While FIGS. 5A and 5B illustrate the memory cells 520 and 530 as 1T-1C, some of the descriptions provided with respect to the IC devices 500A and 500B are applicable to the memory layers 430-1 and 430-2 implementing other types of backend memory, e.g., 2T memory cells, or 1T memory cells, all of which being within the scope of the present disclosure. Therefore, in the remainder of FIGS. 5A-5K, the memory cells 520 and 530 are shown as boxes with respective patterns and the details of these memory cells (e.g., access transistors, capacitors, etc.) are not illustrated. While FIGS. 5C-5K illustrate b2b bonding of the IC structures 401 and 402, similar to that shown in FIG. 5A, descriptions provided with respect to FIGS. 5C-5K are also applicable to f2b bonding of the IC structures 401 and 402 that was described with reference to FIG. 5B.

FIG. 5C illustrates an IC device 500C that is similar to the IC device 500A, described above, illustrating that, in some embodiments, the support structure over which the frontend devices 504 of the compute logic layer 420-2 are fabricated may be removed to expose the back sides of the frontend devices 504, and a direct electrical connection may be made from one of the interconnects 508 of the first IC structure 401 to the frontend devices 504. For example, one of the interconnects 508 may extend, from the first IC structure 401, through the bonding interface 440-12, to directly couple to a source terminal or a drain terminal of at least one of the frontend devices 504. Such an interconnect 508 may further couple to one of the memory cells 530 of the first IC structure 401, thereby communicatively coupling one or more of the memory cells 530 of the first IC structure 401 and one or more of the frontend devices 504 of the compute logic layer 420-2, as is illustrated in FIG. 5C with an electrical feedthrough network 524 of the interconnects 508 (shown within a dotted contour labeled in FIG. 5C with the reference numeral "524"). Trapezoids of the cross-sections of some of the interconnects in the IC device 500C, e.g., as shown in FIG. 5C, may be indicative of the arrangement of the IC structures 401 and 402 with respect to one another.

Alternatively or additionally to a direct electrical connection from one or more components of the IC structure 401 to the frontend devices 504 of the IC structure 402, in some embodiments, an indirect electrical connection may be made. An example of this is shown in FIG. 5D, illustrating an IC device 500D that is similar to the IC device 500A, described above, illustrating that, in some embodiments, the IC device 500D may include an interconnect that extends through the bonding interface 440-12 to electrically couple one or more of the interconnects 508 of the first IC structure 401 (which one or more of the interconnects may be coupled to one or more components of the first memory layer 430-1) directly to one or more interconnects 508 of the second IC structure 402 (which one or more of the interconnects may be coupled to one of a source terminal, a drain terminal, or a gate terminal of at least one of the frontend devices 504). An example electrical feedthrough network 526 of the interconnects 508 (shown within a dotted contour labeled in FIG. 5D with the reference numeral "526") illustrates such an embodiment. Trapezoids of the cross-sections of some of the interconnects in the IC device 500D, e.g., as shown in FIG. 5D, may be indicative of the arrangement of the IC structures 401 and 402 with respect to one another.

Thus, FIGS. 5C and 5D illustrate two examples of how components of the memory layer 430-1 may be coupled to components of the compute logic layer 420-2, so that the compute logic layer 420-2 may be shared between components of the memory layer 430-2 (to which it may be coupled when the IC structure 402 is fabricated) and components of the memory layer 430-1 (to which it may be coupled after the IC structure 402 is bonded with the IC structure 401). Alternatively or additionally to the manner of coupling components as shown in FIGS. 5C and 5D, components of the memory layer 430-1 may be coupled to components of the compute logic layer 420-2 using one or more vias that may be provided after the IC structures 401 and 402 are bonded together and that extend through one of the IC structures 401 and 402 entirely and at least partially into the other one of these IC structures. Two examples of such implementations are shown in FIGS. 5E and 5F with after-bonding vias 540. Trapezoids of the cross-sections of some of the interconnects in the IC device 500E, e.g., as shown in FIG. 5E, and in the IC device 500F, e.g., as shown in FIG. 5F, may be indicative of the arrangement of the IC structures 401 and 402 with respect to one another. Furthermore, trapezoid shapes of the after-bonding vias 540 in such IC devices 500 may indicate from which side of the IC device 500 a given after-bonding via 540 was formed.

FIG. 5E illustrates an IC device 500E that is similar to the IC device 500A, described above, illustrating that, in some embodiments, after the IC structures 401 and 402 are bonded together, an after-bonding via 540 may be provided, extending from the front side 534-2 of the IC structure 402 towards and reaching the back side 534-1 of the IC structure 402, further extending through the bonding interface 440-12, and at least partially into the IC structure 401 (i.e., extending from the back side 534-1 of the of the IC structure 401 towards the front side 534-2 of the of the IC structure 401, for the b2b arrangement as shown in FIG. 5E). In the IC structure 402 of the IC device 500E, the after-bonding via 540 may be coupled to one or more interconnects 508 in the IC structure 402 that are coupled to the frontend devices 504 of the compute logic layer 420-2, while, in the IC structure 401, the after-bonding via 540 may be coupled to one or more interconnects 508 in the IC structure 401 that are coupled to the components of the memory layer 430-1 (e.g., to the memory cells 530), as is illustrated in FIG. 5E with an example electrical feedthrough network 542 of the interconnects 508 (shown within a dotted contour labeled in FIG. 5E with the reference numeral "542"). While FIG. 5E illustrates the after-bonding via 540 extending through all of the IC structure 402 and only partially into the IC structure 401, terminating on one of the interconnects 508 in the IC structure 401, in other embodiments of the IC device 500E, such a via may extend all through the IC structure 401, i.e., to the back side of the IC device 500E (e.g., defined by the front side 534-2 of the IC structure 401, for the b2b arrangement as shown in FIG. 5E), or may terminate directly on one or more of the memory cells 530 of the IC structure 401.

FIG. 5F illustrates an IC device 500F that is similar to the IC device 500A, described above, illustrating that, in some embodiments, after the IC structures 401 and 402 are bonded together, a after-bonding via 540 may be provided, extending from the front side 534-2 of the IC structure 401 towards and reaching the back side 534-1 of the IC structure 401, further extending through the bonding interface 440-12, and at least partially into the IC structure 402 (i.e., extending from the back side 534-1 of the of the IC structure 402 towards the front side 534-2 of the of the IC structure 402, for the b2b arrangement as shown in FIG. 5F). In the IC structure 402 of the IC device 500F, the after-bonding via 540 may be coupled to one or more interconnects 508 in the IC structure 401 that are coupled to the components of the memory layer 430-1 (e.g., to the memory cells 530), while, in the IC structure 402, the after-bonding via 540 may be coupled to one or more interconnects 508 in the IC structure 402 that are coupled to the frontend devices 504 of the compute logic layer 420-2, as is illustrated in FIG. 5F with an example electrical feedthrough network 544 of the interconnects 508 (shown within a dotted contour labeled in FIG. 5F with the reference numeral "544"). FIG. 5F further illustrates that, in some embodiments, such a after-bonding via 540, extending through all of the IC structure 401 and only partially into the IC structure 402, may terminate on one of the interconnects 518 of the power and/or signal layer 450-2. In other embodiments, the after-bonding via 540 of the IC device 500F may terminate on one of the interconnects 508 in the IC structure 402, or extend all through the IC structure 402, i.e., to the front side of the IC device 500F (e.g., defined by the front side 534-2 of the IC structure 402, for the b2b arrangement as shown in FIG. 5F), or may terminate directly on one or more of the frontend devices 504 of the compute logic layer 420-2 of the IC structure 402.

FIGS. 5G and 5H illustrate further examples of electrical connections that may be made in the IC devices 400/500 after the individual IC structures are bonded together. In particular, FIG. 5G illustrates an IC device 500G that is similar to the IC device 500A, described above, illustrating that, in some embodiments, after the IC structures 401 and 402 are bonded together and after the additional support structure 405-2 is attached to the IC structure 402 (e.g., to the front side 534-2 of the IC structure 402, for the b2b arrangement shown in FIG. 5G), a TSV 550 may be provided. In such embodiments, the TSV 550 may extend from front of the additional support structure 405-2, defined by a face 552, all the way through the additional support structure 405-2, and terminate at one of the interconnects in the IC structure 402. The additional support structure 405-2 may be as described above with reference to FIG. 4C. FIG. 5G illustrates an embodiment where the TSV 550 is coupled to one of the interconnects 518 of the power and/or signal layer 450-2. However, in other embodiments of the IC device 500G, the TSV 550 may terminate (i.e., be coupled to) on any other interconnects of the IC structure 402, e.g., any of the interconnects 508 of the memory layer 430-2, or on one or more of the memory cells 520 of the IC structure 402, or on one or more of the frontend devices 504 of the compute logic layer 420-2 of the IC structure 402. In yet other embodiments of the IC device 500G, the TSV 550 may extend all the way through the IC structure 402, through the bonding interface 440-12, and at least partially into the IC structure 401, and may terminate on any interconnect of the IC structure 401 (e.g., on any of the interconnects 508 of the memory layer 430-1), or on one or more of the memory cells 530 of the IC structure 401.

FIG. 5H illustrates an IC device 500H that is similar to the IC device 500A, described above, illustrating that, in some embodiments, after the IC structures 401 and 402 are bonded together and after the additional support structure 405-1 is attached to the IC structure 401 (e.g., to the front side 534-2 of the IC structure 401, for the b2b arrangement shown in FIG. 5H), a TSV 550 may be provided. The additional support structure 405-1 may be as described above with reference to FIG. 4C. In such embodiments, the TSV 550 may extend from back of the additional support structure 405-1, defined by a face 554, all the way through the additional support structure 405-1, all the way through the IC structure 401, the bonding interface 440-12, and at least partially into the IC structure 402, terminating at one of the interconnects in the IC structure 402. FIG. 5H illustrates an embodiment where the TSV 550 is coupled to one of the interconnects 508 of the memory layer 430-2. However, in other embodiments of the IC device 500H, the TSV 550 may terminate (i.e., be coupled to) on any other interconnects of the IC structure 402, e.g., any of the interconnects 518 of the power and/or signal layer 450-2, or on one or more of the memory cells 520 of the IC structure 402, or on one or more of the frontend devices 504 of the compute logic layer 420-2 of the IC structure 402. In yet other embodiments of the IC device 500H, the TSV 550 may only partially extend through the IC structure 401 and not extend all the way through the IC structure 402, in which case it may terminate on any interconnect of the IC structure 401 (e.g., on any of the interconnects 508 of the memory layer 430-1), or on one or more of the memory cells 530 of the IC structure 401.

Trapezoids of the cross-sections of some of the interconnects in the IC device 500G, e.g., as shown in FIG. 5G, and in the IC device 500H, e.g., as shown in FIG. 5H, may be indicative of the arrangement of the IC structures 401 and 402 with respect to one another. Furthermore, trapezoid shapes of the TSVs 550 in such IC devices 500 may indicate from which side of the IC device 500 a given TSV 550 was formed.

The TSVs 550 may be different from the after-bonding vias 540 described above. For example, while both the TSVs 550 and the after-bonding vias 540 may be at least partially filled with one or more electrically conductive materials (e.g., lined with electrically conductive material liners or fully filled with electrically conductive materials), the TSVs 550 may have a liner 556 (shown in FIGS. 5G and 5H) of an insulator material separating the electrically conductive materials of the TSVs 550 from the bulk of the additional support structure 405 through which a given TSV 550 is provided, whereas the after-bonding vias 540 may not need such an insulator liner. This difference may arise from the fact that the TSVs 550 extend through the bulk material of the additional support structures 405, which may be a semiconductor material, and therefore, it would be desirable to electrically isolate the power and/or signals transmitted in the electrically conductive materials of the TSVs 550 from the semiconductor material of the additional support structures 405. On the other hand, the after-bonding vias 540 extend through the ILD materials of the IC structures 401, 402, and, therefore, the power and/or signals transmitted in the electrically conductive materials of the after-bonding vias 540 are isolated from other components of the IC structures 401, 402 by the ILD materials 506, 516.

While some example connectivity of the after-bonding vias 540 and the TSVs 550 was described above and illustrated in FIGS. 5E-5H, in general, any of the after-bonding vias 540 and the TSVs 550 may be used to communicatively couple components of the memory layer 430-1 may be coupled to components of the compute logic layer 420-2 or may be used to provide power and/or signals to any of the components of the IC structures 401, 402. In various embodiments, a plurality of after-bonding vias 540 and/or a plurality of the TSVs 550 may be provided in any of the IC devices 400/500, described herein. In various embodiments, any combination of one or more of the after-bonding vias 540 as described herein and/or any combination of one or more of the TSVs 550 as described herein may be provided in any of the IC devices 400/500.

As described above, in some embodiments, more than two IC structures may be bonded together to implement bilayer memory stacking with compute logic circuits shared between bottom and top memory layers. Some examples of such embodiments are shown in FIGS. 5I-5K.

FIG. 5I illustrates an IC device 500I that is similar to the IC device 500A, described above, illustrating that, in some embodiments, the third IC structure 403 may be coupled to the IC structure 401, as was also described above with reference to FIG. 4B. FIG. 5I illustrates that the IC structure 403 may include frontend devices 564, which may be similar to the frontend devices 504, or may be different from such devices. For example, as described above, in some embodiments, the IC structure 403 may include high-voltage transistors as at least some of the frontend devices 564, in which case the gate dielectric of such transistors may be thicker than that of the transistors of the frontend devices 504. Other descriptions provided above with reference to bonding the IC structure 403 to one of the IC structures 401 and 402, e.g., provided with reference to FIG. 4B, are applicable to various embodiments of the IC device 500I. The IC device 500I illustrates a b2b arrangement of the IC structures 401 and 402, and a f2f arrangement of the IC structures 403 and 401. The latter is seen in FIG. 5I because the bonding interface 440-31 is an interface between the front side 534-2 of the IC structure 403 and the front side 534-2 of the IC structure 401. Again, trapezoids of the cross-sections of some of the interconnects in the IC device 500I, e.g., as shown in FIG. 5I, may be indicative of the arrangement of the IC structures 401, 402, and 403 with respect to one another.

FIG. 5J illustrates an IC device 500J that is similar to the IC device 500I, described above, illustrating that, in some embodiments, the IC structures 401 and 402 may be bonded in a b2b arrangement, and the third IC structure 403 may be bonded to the IC structure 401 in a b2f arrangement. The latter is seen in FIG. 5J because the bonding interface 440-31 is an interface between the back side 534-1 of the IC structure 403 and the front side 534-2 of the IC structure 401. Again, trapezoids of the cross-sections of some of the interconnects in the IC device 500J, e.g., as shown in FIG. 5J, may be indicative of the arrangement of the IC structures 401, 402, and 403 with respect to one another.

FIG. 5K illustrates an IC device 500K that is similar to the IC device 500A, described above, illustrating that, in some embodiments, multiple bilayer stacks with compute logic circuits shared between bottom and top memory layers may be bonded together, as was also described above with reference to FIG. 4. FIG. 5K illustrates the IC structures 401 and 402 bonded together as shown in FIG. 5A, and further illustrating another bilayer stack, formed by bonding of the IC structures 404 and 405 together. The IC structures 404 and 405 may be bonded together similar to how it was described for the IC structures 401 and 402. In particular, the IC structure 404 may be analogous to the IC structure 401 and the IC structure 405 may be analogous to the IC structure 402. Thus, continuing with the analogy, a compute logic layer 420-5 of the IC structure 405 may be shared between a memory layer 430-5 of the IC structure 405 and a memory layer 430-4 of the IC structure 404, and a bonding interface 440-45 may be between a back side 534-1 of the IC structure 404 and a back side 534-1 of the IC structure 405. In such embodiments, a bonding interface 440-51 may be between a front side 534-2 of the IC structure 405 and a front side 534-2 of the IC structure 401. Although not specifically shown in FIG. 5K, any of the frontend components of the compute logic layers 420-2 and 420-5 may be shared (e.g., communicatively coupled to) any of the memory cells of any of the memory layers of the IC structures 401, 402, 404, and 405. In various further embodiments, any of the after-bonding vias 540 and/or TSVs 550 may be included in the IC device 500K. Furthermore, the IC device 500K provides only one example illustration of how multiple bilayer stacks with compute logic circuits shared between bottom and top memory layers may be bonded together, and various further embodiments are possible and are within the scope of the present disclosure. Trapezoids of the cross-sections of some of the interconnects in the IC devices 500 implementing multiple bilayer stacks with compute logic circuits shared between bottom and top memory layer, e.g., as shown in FIG. 5K, may be indicative of the arrangement of various IC structures with respect to one another. Any of the bonding interfaces of an IC device 500 with multiple bilayer stacks with compute logic circuits shared between bottom and top memory layers may be implemented as the bonding interface 440-12, e.g., as described above.

In various embodiments, the interconnects 508, the interconnects 518, the after-bonding vias 540, and the TSVs 550 may be implemented as known in the art. For example, in some embodiments, any of the interconnects 508, the interconnects 518, the after-bonding vias 540, and the TSVs 550 may include an electrically conductive fill material and, optionally, a liner. The electrically conductive fill material may include one or more of copper, tungsten, aluminum, ruthenium, cobalt, etc. (e.g., in proportions of between 1:1 to 1:100), or any of the electrically conductive materials described above. The liner may be an adhesion liner and/or a barrier liner. For example, the liner may be a liner having one or more of tantalum, tantalum nitride, titanium nitride, tungsten carbide, cobalt, etc. In the liner and/or in the electrically conductive fill material of any of the interconnects 508, the interconnects 518, the after-bonding vias 540, and the TSVs 550, any of the individual materials (e.g., any of the examples listed above) may be included in the amount of between about 1% and 75%, e.g., between about 5% and 50%, indicating that these materials are included by intentional alloying of materials, in contrast to potential accidental doping or impurities being included, which would be less than about 0.1% for any of these metals. In general, material compositions of liners and/or electrically conductive fill materials of any of the interconnects 508, the interconnects 518, the after-bonding vias 540, and the TSVs 550 may, but do not have to be, the same. The insulator 516 may include any of the materials described with reference to the ILD 506, where, in general, material compositions of the insulator 516 and the ILD 506 may, but do not have to be, the same.

IC devices implementing bilayer memory stacking with compute logic circuits shared between bottom and top memory layers, as described herein, may be fabricated using any suitable techniques, e.g., subtractive, additive, damascene, dual-damascene, etc. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

Figure 6:
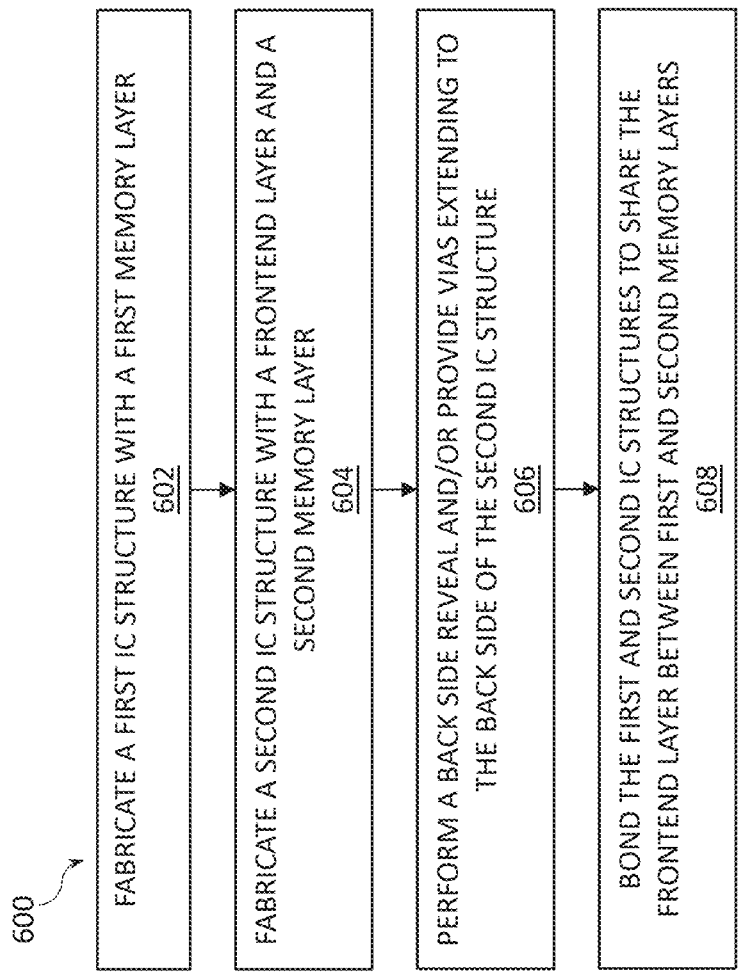
FIG. 6 is a flow diagram of a method of manufacturing an IC device implementing bilayer memory stacking with compute logic circuits shared between bottom and top memory layers, according to some embodiments of the present disclosure.

FIG. 6 is a flow diagram of a method 600 of manufacturing an IC device implementing bilayer memory stacking with compute logic circuits shared between bottom and top memory layers (e.g., any of the IC devices 400/500, described herein), according to some embodiments of the present disclosure. The example fabrication method shown in FIG. 6 may include other operations not specifically shown in FIG. 6, such as various cleaning or planarization operations as known in the art. For example, in some embodiments, any of the layers of the IC device, or the individual IC structures provided within the IC device, may be cleaned prior to, after, or during any of the processes of the fabrication method described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the top surfaces of the IC devices, or the individual IC structures provided within the IC devices, described herein may be planarized prior to, after, or during any of the processes of the fabrication method described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

As shown in FIG. 6, the fabrication method 600 may include a process 602, that includes fabricating a first IC structure with a first memory layer. The first IC structure fabricated in the process 602 may include any embodiments of the IC structure 401, described herein, and the first memory layer fabricated in the process 602 may include any embodiments of the memory layer 430-1, described herein. In the process 602, the first memory layer may be fabricated over a first support structure. The method 600 may also include a process 604, that includes fabricating a second IC structure with a compute logic layer and a second memory layer. The second IC structure fabricated in the process 604 may include any embodiments of the IC structure 402, described herein, the second memory layer fabricated in the process 604 may include any embodiments of the memory layer 430-2, described herein, and the compute logic layer fabricated in the process 604 may include any embodiments of the compute logic layer 420-2, described herein. In the process 604, the compute logic layer and the second memory layer may be fabricated over a second support structure, different from the first support structure of the process 602. In various embodiments, the processes 602 and 604 may be performed sequentially or in a time-overlapping manner, in any order.

As further shown in FIG. 6, the fabrication method 600 may also include a process 606, that may include performing a back side reveal to remove at least a portion of the second support structure that was used in the process 604, to expose one or more of a source region and a drain region of one or more of the frontend transistors of the compute logic layer fabricated in the process 604. Additionally or alternatively, the process 606 may include providing vias that extend to the back side of the second support structure that was used in the process 604, e.g., vias that extend through the second support structure, the vias coupled to one or more of a source region and a drain region of one or more of the frontend transistors of the compute logic layer fabricated in the process 604. The method 600 may further include a process 608, that includes bonding the IC structures formed in the processes 602 and 606, so that the compute logic layer of the second IC structure is shared among first and second memory layers. Bonding of the IC structures may be performed in the process 608 as described above, e.g., as oxide-oxide bonding.

IC devices implementing bilayer memory stacking with compute logic circuits shared between bottom and top memory layers as disclosed herein may be included in any suitable electronic device. FIGS. 7-11 illustrate various examples of devices and components that may include one or more IC devices implementing bilayer memory stacking with compute logic circuits shared between bottom and top memory layers as disclosed herein.

FIGS. 7A-7B are top views of a wafer 2000 and dies 2002 that may include one or more IC devices implementing bilayer memory stacking with compute logic circuits shared between bottom and top memory layers in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 9. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including structures implemented implementing bilayer memory stacking with compute logic circuits shared between bottom and top memory layers as described herein). After the fabrication of the semiconductor product is complete (e.g., after manufacture of one or more IC devices implementing bilayer memory stacking with compute logic circuits shared between bottom and top memory layers as described herein, e.g., any embodiment of the IC devices implementing bilayer memory stacking with compute logic circuits shared between bottom and top memory layers, described herein), the wafer 2000 may undergo a singulation process in which each of the dies 2002 is separated from one another to provide discrete "chips" of the semiconductor product. In particular, devices that include IC structures implementing bilayer memory stacking with compute logic circuits shared between bottom and top memory layers as disclosed herein may take the form of the wafer 2000 (e.g., not singulated) or the form of the die 2002 (e.g., singulated). The die 2002 may include one or more transistors (e.g., one or more frontend devices 504 of the compute logic layer 420-2 and one or more transistors 510 of the memory layer 430-2, as described herein and/or one or more frontend transistors 2140 of FIG. 8, discussed below), one or more memory cells (e.g., one or more 1T-1C memory cells or any other backend memory cells as described herein), and/or supporting circuitry (e.g., one or more interconnects as described herein) to route electrical signals to the transistors and/or the memory cells, as well as any other IC components. In some embodiments, the wafer 2000 or the die 2002 may implement or include a memory device, a logic device (e.g., an AND, OR, NAND, or NOR gate), or any other suitable circuit element. Multiple ones of these devices may be combined on a single die 2002. For example, a memory array formed by multiple memory cells in a given layer may be formed on a same die 2002 as a processing device (e.g., the processing device 2402 of FIG. 11) or other logic that is configured to store information in the memory devices or execute instructions stored in the memory array.

Figure 8:
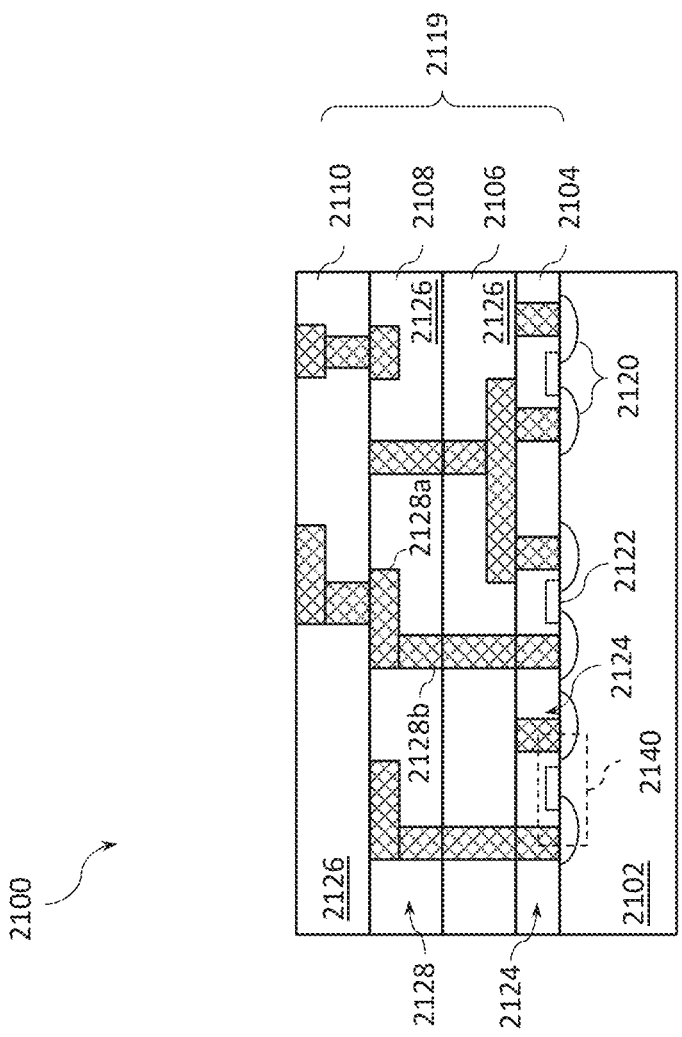
FIG. 8 is a cross-sectional side view of an IC structure that may be one of the IC structures bonded to another one of the IC structures to implement bilayer stacking with compute logic circuits shared between bottom and top memory layers in accordance with any of the embodiments disclosed herein.

FIG. 8 is a cross-sectional side view of one side of an IC structure 2100 that may be one of the IC structures bonded to another one of the IC structures to implement bilayer memory stacking with compute logic circuits shared between bottom and top memory layers in accordance with any of the embodiments disclosed herein. For example, the IC structure 2100 may be any of the IC structures 401, 402, 403, 404, or 405, described above, i.e., may form basis for fabricating an IC device implementing bilayer memory stacking with compute logic circuits shared between bottom and top memory layers, as described herein. In particular, the backend memory as described herein may be implemented in any of the backend layers of the IC structure 2100, e.g., in any of the interconnect layers 2106-2110 shown in FIG. 8. Because there are various possibilities where such backend memory may be integrated in the IC structure 2100, the backend memory is not specifically shown in FIG. 8. In some embodiments, the IC structure 2100 may serve as any of the dies 2256 in the IC package 2300.

As shown in FIG. 8, the IC structure 2100 may include a substrate 2102 over which one or more device layers 2104 are provided. The substrate 2102 may be implemented as the support structure of the IC structures 401, 402, described above. The device layers 2104 provide one example of one or more layers with the frontend devices 504 of the compute logic layer 420-2, described above. The device layer 2104 may include features of one or more transistors 2140 (e.g., metal oxide semiconductor field-effect transistors (MOSFETs)) formed on the substrate 2102. The transistors 2140 provide one example of any of the frontend devices 504, described above. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 216. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode 214.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be adjacent to the gate of each transistor 2140. The S/D regions 2120 may be formed using an implantation/diffusion process or an etching/deposition process, for example.

Various transistors 2140 are not limited to the type and configuration depicted in FIG. 8 and may include a wide variety of other types and configurations such as, for example, planar transistors, non-planar transistors (e.g., FinFETs, nanowire, or nanoribbon transistors), or a combination of transistors of different types and configurations.

The one or more interconnect layers 2106-2110 may form an ILD stack 2119 of the IC structure 2100. In some embodiments, electrical signals, such as power and/or input/output (I/O) signals, may be routed to and/or from the transistors 2140 of the device layer 2104 and/or to backend memory implemented in the ILD stack 2119 of the IC structure 2100 through one or more interconnect layers disposed on the device layer 2104 (illustrated in FIG. 8 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 8). Although a particular number of interconnect layers 2106-1210 is depicted in FIG. 8, embodiments of the present disclosure include IC devices having more or fewer interconnect layers than depicted.

In some embodiments, the interconnect structures 2128 may include trench structures 2128a (sometimes referred to as "lines") and/or via structures 2128B (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 8. The via structures 2128B may be arranged to route electrical signals in a direction of a plane that is substantially perpendicular to the surface of the substrate 2102 upon which the device layer 2104 is formed. In some embodiments, the via structures 2128B may electrically couple trench structures 2128a of different interconnect layers 2106-2110 together.

The interconnect layers 2106-2110 may include a dielectric material 2126 disposed between the interconnect structures 2128, as shown in FIG. 8. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the insulator/dielectric materials described above.

A first interconnect layer 2106 (referred to as Metal 1 or "M1") may be formed directly on the device layer 2104. In some embodiments, the first interconnect layer 2106 may include trench structures 2128a and/or via structures 2128B, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128B to couple the trench structures 2128a of the second interconnect layer 2108 with the trench structures 2128a of the first interconnect layer 2106. Although the trench structures 2128a and the via structures 2128B are structurally delineated with a line within each interconnect layer (e.g., within the second interconnect layer 2108) for the sake of clarity, the trench structures 2128a and the via structures 2128B may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The interconnect layers 2106-2110 may be the metal layers M1-M3, e.g., as described above with reference to the IC device 500. Further metal layers may be present in the IC structure 2100, e.g., as also described above with reference to the IC device 500.

In some embodiments, electrical signals, such as power and/or I/O signals, may be routed to and/or from the transistors 2140 of the device layer 2104 and/or to backend memory implemented in the ILD stack 2119 of the IC structure 2100, e.g., from the power and/or signal layer 450, as described above.

The IC structure 2100 may be formed on the wafer 2000 of FIG. 7A and may be included in a die, e.g., the die 2002 of FIG. 7B.

Figure 9:
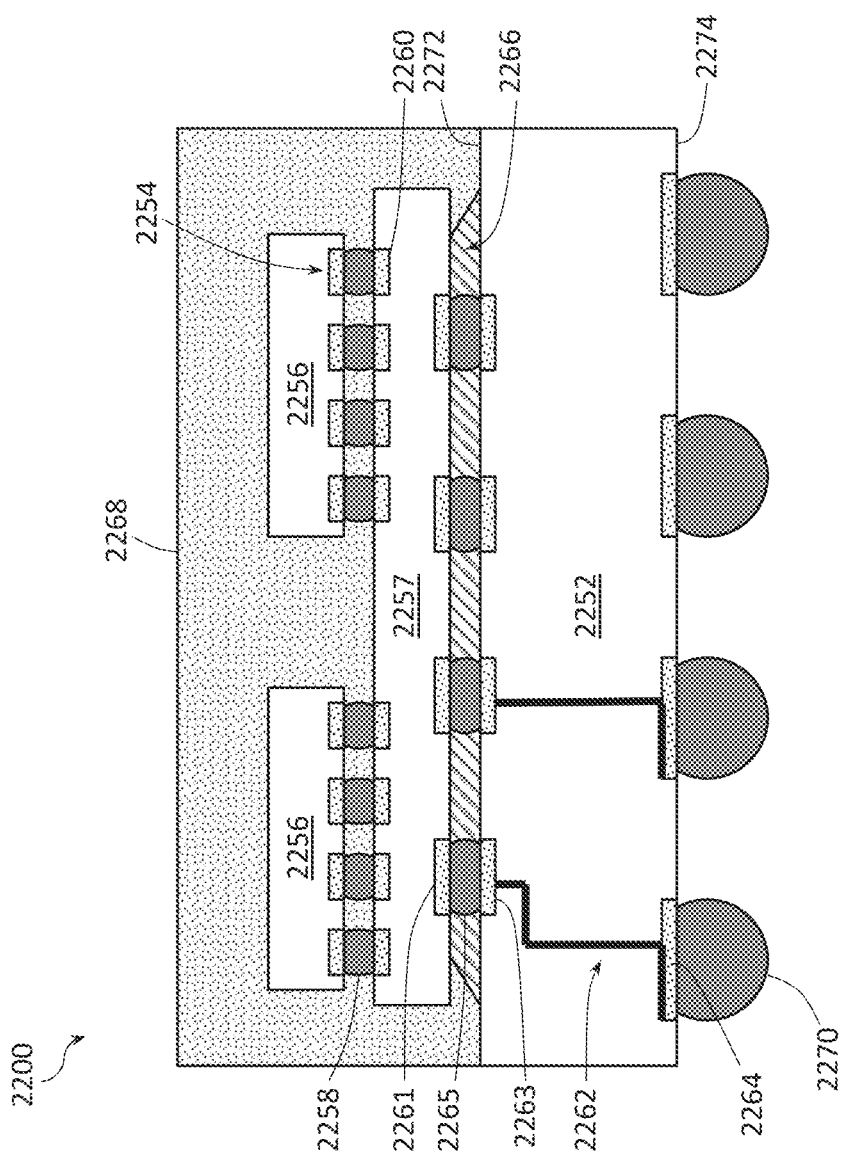
FIG. 9 is a cross-sectional side view of an IC package that may include one or more IC devices implementing bilayer memory stacking with compute logic circuits shared between bottom and top memory layers in accordance with any of the embodiments disclosed herein.

FIG. 9 is a side, cross-sectional view of an example IC package 2200 that may include IC devices implementing bilayer memory stacking with compute logic circuits shared between bottom and top memory layers in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 8.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 9 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 9 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 9 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 10.

In some embodiments, the dies 2256 may take the form of any of the embodiments of the die 2002 discussed herein (e.g., may include any of the embodiments of the IC structure 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include IC devices implementing bilayer memory stacking with compute logic circuits shared between bottom and top memory layers, e.g., as discussed above; in some embodiments, at least some of the dies 2256 may not include any IC devices implementing bilayer memory stacking with compute logic circuits shared between bottom and top memory layers.

The IC package 2200 illustrated in FIG. 9 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 9, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 10:
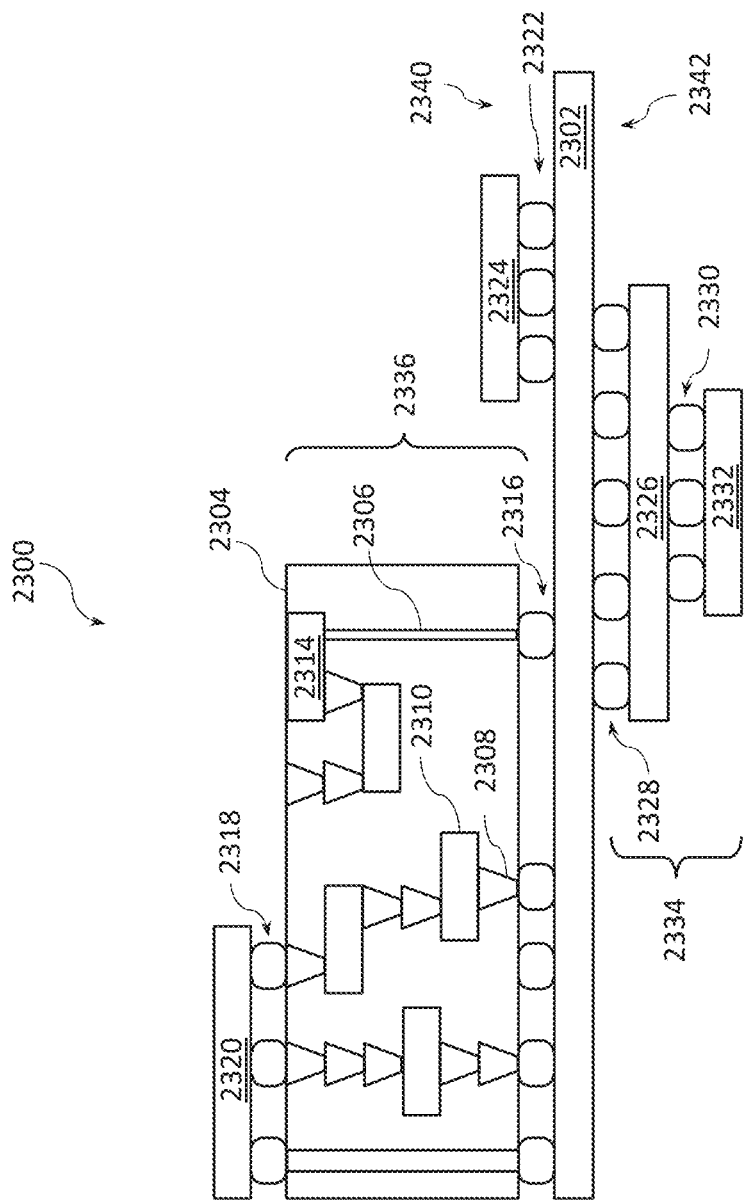
FIG. 10 is a cross-sectional side view of an IC device assembly that may include one or more IC devices implementing bilayer memory stacking with compute logic circuits shared between bottom and top memory layers in accordance with any of the embodiments disclosed herein.

FIG. 10 is a cross-sectional side view of an IC device assembly 2300 that may include components having one or more IC devices implementing bilayer memory stacking with compute logic circuits shared between bottom and top memory layers in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices implementing bilayer memory stacking with compute logic circuits shared between bottom and top memory layers in accordance with any of the embodiments disclosed herein; e.g., any of the IC packages discussed below with reference to the IC device assembly 2300 may take the form of any of the embodiments of the IC package 2200 discussed above with reference to FIG. 9 (e.g., may include one or more IC devices implementing bilayer memory stacking with compute logic circuits shared between bottom and top memory layers provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 10 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 10), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 7B), an IC device (e.g., the IC structure 2100 of FIG. 8), or any other suitable component. In particular, the IC package 2320 may include one or more IC devices implementing bilayer memory stacking with compute logic circuits shared between bottom and top memory layers as described herein. Although a single IC package 2320 is shown in FIG. 10, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 10, the IC package 2320 and the circuit board 2302 are attached to opposing sides of the interposer 2304; in other embodiments, the IC package 2320 and the circuit board 2302 may be attached to the same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 10 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 11:
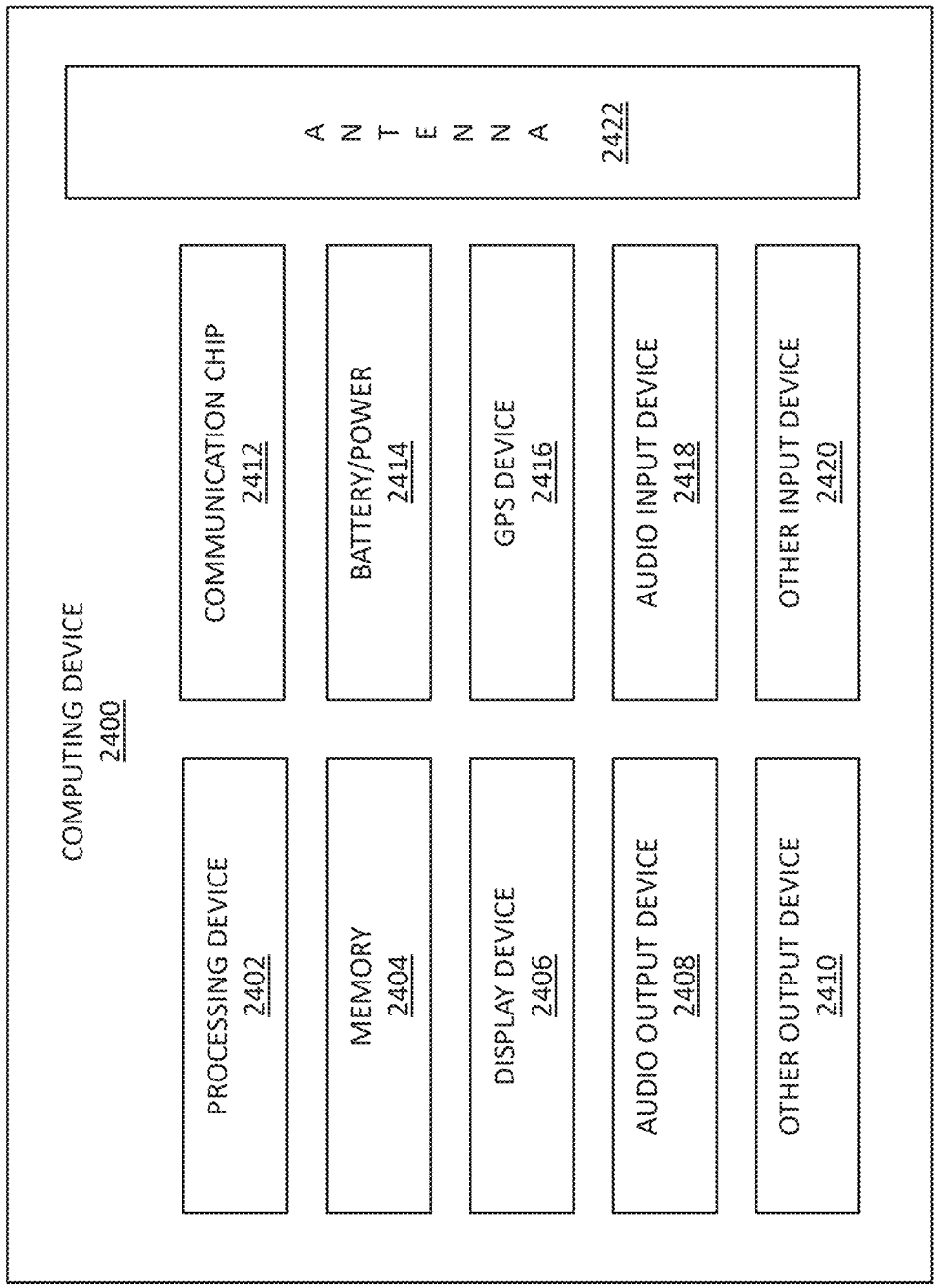
FIG. 11 is a block diagram of an example computing device that may include one or more IC devices implementing bilayer memory stacking with compute logic circuits shared between bottom and top memory layers in accordance with any of the embodiments disclosed herein.

FIG. 11 is a block diagram of an example computing device 2400 that may include one or more components with one or more IC devices implementing bilayer memory stacking with compute logic circuits shared between bottom and top memory layers in accordance with any of the embodiments disclosed herein. For example, any suitable ones of the components of the computing device 2400 may include a die (e.g., the die 2002 (FIG. 7B)) including IC device implementing bilayer memory stacking with compute logic circuits shared between bottom and top memory layers in accordance with any of the embodiments disclosed herein. Any of the components of the computing device 2400 may include an IC structure 2100 (FIG. 8) and/or an IC package 2200 (FIG. 9). Any of the components of the computing device 2400 may include an IC device assembly 2300 (FIG. 10).

A number of components are illustrated in FIG. 11 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 11, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408 but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory. The memory 2404 may include one or more IC devices implementing bilayer memory stacking with compute logic circuits shared between bottom and top memory layers as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 602.11 family), IEEE 602.16 standards (e.g., IEEE 602.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 602.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 602.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides an IC device that includes a first IC structure (e.g., the IC structure 401), including a first memory layer (e.g., the memory layer 430-1); and a second IC structure (e.g., the IC structure 402), including a stack of a second memory layer (e.g., the memory layer 430-2) and a compute logic layer (e.g., the compute logic layer 420-2); the second IC structure being bonded to the first IC structure, where the first IC structure and the second IC structure are bonded together so that one or more components of the compute logic layer of the second IC structure are electrically coupled (e.g., communicatively coupled) to one or more components of the first memory layer.

Example 2 provides the IC device according to example 1, where one or more components of the compute logic layer of the second IC structure are electrically coupled (e.g., communicatively coupled) to one or more components of the second memory layer.

Example 3 provides the IC device according to examples 1 or 2, where the compute logic layer of the second IC structure is between the first memory layer and the second memory layer.

Example 4 provides the IC device according to any one of the preceding examples, further including a bonding interface between the first IC structure and the second IC structure.

Example 5 provides the IC device according to example 4, where the bonding interface is between the compute logic layer of the second IC structure and the first memory layer, and the compute logic layer of the second IC structure is between the bonding interface and the second memory layer.

Example 6 provides the IC device according to any one of the preceding examples, where, in a plane that is substantially perpendicular to a bonding interface between the first IC structure and the second IC structure, a cross-section of each of a plurality of interconnects of the first IC structure and a plurality of interconnects of the second IC structure is substantially a trapezoid that includes two parallel sides, one of which is a short side and another one of which is a long side. In such an IC device, for each trapezoid of the plurality of interconnects of the first IC structure, the short side is closer to the bonding interface than the long side, and, for each trapezoid of the plurality of interconnects of the second IC structure, the short side is closer to the bonding interface than the long side.

Example 7 provides the IC device according to any one of the preceding examples, where one or more memory cells of the second memory layer are oriented in the IC device upside down with respect to one or more memory cells of the first memory layer.

Example 8 provides the IC device according to any one of the preceding examples, where each of a plurality of memory cells of the first memory layer includes a first access transistor; each of a plurality of memory cells of the second memory layer includes a second access transistor; for each of one or more memory cells of the first memory layer, a gate electrode of the first access transistor is closer to a bonding interface between the first IC structure and the second IC structure than a channel material of the first access transistor; and, for each of one or more memory cells of the second memory layer, a gate electrode of the second access transistor is closer to the bonding interface than a channel material of the second access transistor.

Example 9 provides the IC device according to example 8, where, for the each of one or more memory cells of the first memory layer, the channel material of the first access transistor is closer to the bonding interface than at least one of a source contact and a drain contact of the first access transistor. Furthermore, for the each of one or more memory cells of the second memory layer, the channel material of the second access transistor is closer to the bonding interface than at least one of a source contact and a drain contact of the second access transistor.

Example 10 provides the IC device according to any one of the preceding examples, where the compute logic layer includes a plurality of transistors (e.g., frontend transistors, e.g., implemented as FinFETs, nanowire transistors, nanoribbon transistors, nanosheet transistors, or planar transistors), and where the IC device further includes an interconnect that extends through a bonding interface between the first IC structure and the second IC structure to electrically couple an interconnect of the first IC structure that is coupled to one or more components of the first memory layer directly to a source terminal or a drain terminal of at least one of the plurality of transistors of the compute logic layer.

Example 11 provides the IC device according to any one of the preceding examples, where the compute logic layer includes a plurality of transistors (e.g., frontend transistors, e.g., implemented as FinFETs, nanowire transistors, nanoribbon transistors, nanosheet transistors, or planar transistors), and the IC device further includes an interconnect that extends through a bonding interface between the first IC structure and the second IC structure to electrically couple an interconnect of the first IC structure that is coupled to one or more components of the first memory layer directly to an interconnect of the second IC structure that is coupled to one of a source terminal, a drain terminal, or a gate terminal of at least one of the plurality of transistors of the compute logic layer.

Example 12 provides the IC device according to any one of the preceding examples, where each of the first IC structure and the second IC structure has a first face and a second face, the second face being opposite the first face; the first IC structure and the second IC structure are bonded together so that the first face of the first IC structure is bonded to the first face of the second IC structure; the IC device further includes a support structure that has a first face and a second face, the second face of the support structure being opposite the first face of the support structure; the first face of the support structure is attached to the second face of the first IC structure or the second face of the second IC structure; and the IC device further includes a TSV that extends from the second face of the support structure to the first face of the support structure and terminates at one or more interconnects of the first IC structure or one or more interconnects of the second IC structure.

Example 13 provides the IC device according to example 12, where the TSV includes an opening that extends between the second face of the support structure and the first face of the support structure, a liner of an insulator material lining sidewalls of the opening, and an electrically conductive material at least partially filling the opening lined with the liner of the insulator material so that the insulator material is between a bulk material of the support structure and the electrically conductive material.

Example 14 provides the IC device according to any one of the preceding examples, further including a via that extends through all of one of the first IC structure and the second IC structure, a bonding interface between the first IC structure and the second IC structure, and at least partially into another one of the first IC structure and the second IC structure, the via including an opening and an electrically conductive material at least partially filling the opening, where the via may be such that no liner of an insulator material is provided on the sidewalls of the opening for the via, in contrast to the TSV of the preceding examples.

Example 15 provides the IC device according to any one of the preceding examples, where a bonding interface between the first IC structure and the second IC structure includes a material in at least portions where a face of the first IC structure is bonded to a face of the second IC structure, the material including silicon, nitrogen, and carbon, where an atomic percentage of each of silicon, nitrogen, and carbon within the material is at least about 1%, e.g., at least about 5%, e.g., between about 1% and 50%, indicating that these elements are added deliberately, as opposed to being accidental impurities which are typically in concentration below about 0.1%.

Example 16 provides the IC device according to any one of the preceding examples, further including a third IC structure (e.g., the IC structure 403), including a third memory layer (e.g., the memory layer 430-3), the third IC structure being bonded to the first IC structure, where the first IC structure and the third IC structure are bonded together so that one or more components of the first memory layer are electrically coupled (e.g., communicatively coupled) to one or more components of the third memory layer.

Example 17 provides the IC device according to example 16, where the third IC structure includes a stack of the third memory layer and a compute logic layer (e.g., the compute logic layer 420-3), and where the first IC structure and the third IC structure are bonded together so that one or more components of the first memory layer are electrically coupled (e.g., communicatively coupled) to one or more components of the compute logic layer of the third IC structure.

Example 18 provides an IC package that includes an IC device according to any one of the preceding examples; and a further IC component, coupled to the IC device. For example, the IC device may include a first IC structure, including a first backend layer that includes first backend memory cells. The IC device may further include a second IC structure, bonded to the first IC structure, the second IC structure including a frontend layer that includes frontend transistors, the frontend transistors including one or more of fin-based transistors, nanoribbon transistors, or nanowire transistors, and the second IC structure further including a second backend layer that includes second backend memory cells coupled to the frontend transistors. The IC device may also include a bonding interface between the first IC structure and the second IC structure, and one or more interconnects extending through the bonding interface, the one or more interconnects coupling the first backend memory cells of the first IC structure to the frontend transistors of the second IC structure.

Example 19 provides the IC package according to example 18, where the further IC component includes one of a package substrate, an interposer, or a further IC die.

Example 20 provides the IC package according to examples 18 or 19, where the IC device includes, or is a part of, at least one of a memory device, a computing device, a wearable device, a handheld electronic device, and a wireless communications device.

Example 21 provides an electronic device that includes a carrier substrate; and one or more of the IC device according to any one of the preceding examples and the IC package according to any one of the preceding examples, coupled to the carrier substrate.

Example 22 provides the electronic device according to example 21, where the carrier substrate is a motherboard.

Example 23 provides the electronic device according to example 21, where the carrier substrate is a PCB.

Example 24 provides the electronic device according to any one of examples 21-23, where the electronic device is a wearable electronic device (e.g., a smart watch) or handheld electronic device (e.g., a mobile phone).

Example 25 provides the electronic device according to any one of examples 21-24, where the electronic device further includes one or more communication chips and an antenna.

Example 26 provides the electronic device according to any one of examples 21-25, where the electronic device is an RF transceiver.

Example 27 provides the electronic device according to any one of examples 21-25, where the electronic device is one of a switch, a power amplifier, a low-noise amplifier, a filter, a filter bank, a duplexer, an upconverter, or a downconverter of an RF communications device, e.g., of an RF transceiver.

Example 28 provides the electronic device according to any one of examples 21-25, where the electronic device is a computing device.

Example 29 provides the electronic device according to any one of examples 21-28, where the electronic device is included in a base station of a wireless communication system.

Example 30 provides the electronic device according to any one of examples 21-28, where the electronic device is included in a user equipment device (i.e., a mobile device) of a wireless communication system.

Example 31 provides a method of fabricating an IC device. The method includes fabricating a first IC structure that includes a first memory layer over a first support structure (e.g., a first substrate, die, wafer, or chip); fabricating a second IC structure that includes a frontend layer over a second support structure (e.g., a second substrate, die, wafer, or chip), and further includes a second memory layer over the frontend layer, where frontend transistors of the frontend layer are coupled to one or more memory cells of the second memory layer; and bonding the first IC structure and the second IC structure so that the frontend layer of the second IC structure is between the first memory layer and the second memory layer and so that the frontend transistors of the frontend layer are further coupled to one or more memory cells of the first memory layer.

Example 32 provides the method according to example 31, further including, prior to bonding, performing a backside reveal to remove at least a portion of the second support structure to expose one or more of a source region and a drain region of one or more of the frontend transistors, where bonding the first IC structure and the second IC structure so that the frontend transistors of the frontend layer are coupled to one or more memory cells of the first memory layer includes bonding the first IC structure and the second IC structure so that one or more interconnects of the first IC structure coupled to the one or more memory cells of the first memory layer are coupled to (e.g., in contact with) the exposed one or more of the of the source region and the drain region of the one or more of the frontend transistors.

Example 33 provides the method according to example 31, further including, prior to bonding, providing one or more electrically conductive vias extending through the second support structure, the one or more conductive vias coupled to one or more of a source region and a drain region of one or more of the frontend transistors, where bonding the first IC structure and the second IC structure so that the frontend transistors of the frontend layer are coupled to one or more memory cells of the first memory layer includes bonding the first IC structure and the second IC structure so that one or more interconnects of the first IC structure coupled to the one or more memory cells of the first memory layer are coupled to (e.g., in contact with) the one or more conductive vias extending through the second support structure.

Example 34 provides the method according to any one of examples 31-33, where bonding the first IC structure and the second IC structure includes providing a bonding material over one or more of at least a portion of a face of the first IC structure that is to be bonded to the second IC structure and at least a portion of a face of the second IC structure that is to be bonded to the first IC structure, the bonding material including silicon, nitrogen, and carbon, where an atomic percentage of each of silicon, nitrogen, and carbon within the material is at least about 1%, e.g., at least about 5%, e.g., between about 1% and 50%.

Example 35 provides the method according to any one of examples 31-34, further including processes for forming the IC device according to any one of the preceding examples (e.g., for forming the IC device according to any one of examples 1-17).

Example 36 provides the method according to any one of examples 31-35, further including processes for forming the IC package according to any one of the preceding examples (e.g., for forming the IC package according to any one of examples 18-20).

Example 37 provides the method according to any one of examples 31-36, further including processes for forming the electronic device according to any one of the preceding examples (e.g., for forming the electronic device according to any one of examples 21-30).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
   a first integrated circuit (IC) structure, comprising a first memory layer; and a second IC structure, comprising a stack of a second memory layer and a compute logic layer; the second IC structure being bonded to the first IC structure, wherein the first IC structure and the second IC structure are bonded together so that one or more components of the compute logic layer of the second IC structure are coupled to one or more components of the first memory layer.

2. The IC device according to claim 1, wherein one or more components of the compute logic layer of the second IC structure are coupled to one or more components of the second memory layer.

3. The IC device according to claim 1, wherein the compute logic layer of the second IC structure is spatially between the first memory layer and the second memory layer.

4. The IC device according to claim 1, further comprising a bonding interface spatially between the first IC structure and the second IC structure.

5. The IC device according to claim 4, wherein:
the bonding interface is spatially between the compute logic layer of the second IC structure and the first memory layer, and
the compute logic layer of the second IC structure is spatially between the bonding interface and the second memory layer.

6. The IC device according to claim 1, wherein:
in a plane that is substantially perpendicular to a bonding interface between the first IC structure and the second IC structure, a cross-section of an individual one of a plurality of interconnects of the first IC structure and a plurality of interconnects of the second IC structure has a shape that includes a first side and a second side, wherein the second side is opposite the first side, and the first side is shorter than the second side,
for the shape of an individual one of the plurality of interconnects of the first IC structure, the first side is closer to the bonding interface than the second side, and
for the shape of an individual one of the plurality of interconnects of the second IC structure, the first side is closer to the bonding interface than the second side.

7. The IC device according to claim 1, wherein:
an individual one of a plurality of memory cells of the first memory layer includes a first access transistor,
an individual one of a plurality of memory cells of the second memory layer includes a second access transistor,
for one or more memory cells of the first memory layer, a gate electrode of the first access transistor is closer to a bonding interface between the first IC structure and the second IC structure than a channel material of the first access transistor, and
for one or more memory cells of the second memory layer, a gate electrode of the second access transistor is closer to the bonding interface than a channel material of the second access transistor.

8. The IC device according to claim 1, wherein:
the compute logic layer includes a plurality of transistors, and
the IC device further includes an interconnect that extends through a bonding interface between the first IC structure and the second IC structure to couple an interconnect of the first IC structure that is coupled to one or more components of the first memory layer directly to a source terminal or a drain terminal of at least one of the plurality of transistors of the compute logic layer.

9. The IC device according to claim 1, wherein:
the compute logic layer includes a plurality of transistors, and
the IC device further includes an interconnect that extends through a bonding interface between the first IC structure and the second IC structure to couple an interconnect of the first IC structure that is coupled to one or more components of the first memory layer directly to an interconnect of the second IC structure that is coupled to one of a source terminal, a drain terminal, or a gate terminal of at least one of the plurality of transistors of the compute logic layer.

10. The IC device according to claim 1, wherein:
an individual one of the first IC structure and the second IC structure has a first face and a second face, the second face being opposite the first face,
the first face of the first IC structure is bonded to the first face of the second IC structure,
the IC device further includes a support structure that has a first face and a second face, the second face of the support structure being opposite the first face of the support structure,
the first face of the support structure is attached to the second face of the first IC structure or the second face of the second IC structure, and
the IC device further includes a through-substrate via (TSV) that extends from the second face of the support structure to the first face of the support structure and terminates at one or more interconnects of the first IC structure or one or more interconnects of the second IC structure.

11. The IC device according to claim 10, wherein the TSV includes:
an opening that extends between the second face of the support structure and the first face of the support structure,
a liner of an insulator material lining sidewalls of the opening, and
an electrically conductive material at least partially filling the opening lined with the liner of the insulator material.

12. The IC device according to claim 1, wherein a bonding interface between the first IC structure and the second IC structure includes a material in at least portions where a face of the first IC structure is bonded to a face of the second IC structure, the material including silicon, nitrogen, and carbon, where an atomic percentage of each of silicon, nitrogen, and carbon within the material is at least about 1%.

13. The IC device according to claim 1, further comprising:
a third IC structure, comprising a third memory layer, the third IC structure being bonded to the first IC structure,
wherein one or more components of the first memory layer are coupled to one or more components of the third memory layer.

14. The IC device according to claim 13, wherein:
the third IC structure includes a stack of the third memory layer and a compute logic layer, and
one or more components of the first memory layer are coupled to one or more components of the compute logic layer of the third IC structure.

15. The IC device according to claim 1, wherein a back of the first IC structure and a back of the second IC structure are bonded together.

16. An integrated circuit (IC) package, comprising:
an IC device; and
a further IC component, coupled to the IC device, wherein the IC device includes:
- a first IC structure, comprising a first backend layer that includes first backend memory cells,
- a second IC structure, bonded to the first IC structure, the second IC structure comprising a frontend layer that includes frontend transistors, and further comprising a second backend layer that includes second backend memory cells coupled to the frontend transistors,
- a bonding interface between the first IC structure and the second IC structure, and
- one or more interconnects extending through the bonding interface, the one or more interconnects coupling the first backend memory cells to the frontend transistors.

17. The IC package according to claim 16, wherein the further IC component includes one of a package substrate, an interposer, or a further IC die.

18. A method of fabricating an integrated circuit (IC) device, the method comprising:
- fabricating a first IC structure that includes a first memory layer over a first support structure;
- fabricating a second IC structure that includes a frontend layer over a second support structure, and further includes a second memory layer over the frontend layer, where frontend transistors of the frontend layer are coupled to one or more memory cells of the second memory layer; and
- bonding the first IC structure and the second IC structure so that the frontend layer of the second IC structure is between the first memory layer and the second memory layer and so that the frontend transistors of the frontend layer are further coupled to one or more memory cells of the first memory layer.

19. The method according to claim 18, further comprising:
- prior to the bonding, performing a back side reveal to remove at least a portion of the second support structure to expose one or more of a source region and a drain region of one or more of the frontend transistors,
- wherein the bonding includes bonding the first IC structure and the second IC structure so that one or more interconnects of the first IC structure coupled to the one or more memory cells of the first memory layer are coupled to the exposed one or more of the source region and the drain region of the one or more of the frontend transistors.

20. The method according to claim 18, further comprising:
- prior to the bonding, providing one or more conductive vias extending through the second support structure, the one or more conductive vias being coupled to one or more of a source region and a drain region of one or more of the frontend transistors,
- wherein the bonding includes bonding the first IC structure and the second IC structure so that one or more interconnects of the first IC structure coupled to the one or more memory cells of the first memory layer are coupled to the one or more conductive vias extending through the second support structure.

* * * * *